United States Patent [19]

Asai et al.

[11] Patent Number: 5,671,527
[45] Date of Patent: Sep. 30, 1997

[54] ELECTRONIC-COMPONENT MOUNTING SYSTEM

[75] Inventors: Koichi Asai, Nagoya; Koso Matsumoto, Aichi-ken; Kunio Ooe, Chiryu; Masayuki Shimmura, Anjo, all of Japan

[73] Assignee: Fuji Machine Mfg. Co., Ltd., Aichi-ken, Japan

[21] Appl. No.: 551,633

[22] Filed: Nov. 1, 1995

[51] Int. Cl.$^6$ .............................. H05K 3/32; H05K 13/02; H05K 13/04
[52] U.S. Cl. .................. 29/740; 29/712; 29/741; 29/742; 29/743; 29/784; 29/834; 198/341; 414/752
[58] Field of Search ..................... 29/707, 710, 711, 29/712, 740–743, 784, 834; 198/341; 269/9–3; 414/737, 752

[56] References Cited

U.S. PATENT DOCUMENTS

| | | | |
|---|---|---|---|
| 4,346,514 | 8/1982 | Makizawa et al. | 29/834 X |
| 4,631,812 | 12/1986 | Young | 29/740 X |
| 4,719,694 | 1/1988 | Herberich et al. | 29/711 X |
| 5,086,559 | 2/1992 | Akatsuchi | 29/834 |
| 5,145,047 | 9/1992 | Terracel et al. | 198/341 |
| 5,208,969 | 5/1993 | Hidese | 29/741 X |

FOREIGN PATENT DOCUMENTS

| | | | |
|---|---|---|---|
| 0 389 048 | 9/1990 | European Pat. Off. | 29/834 |
| 491488 | 6/1992 | European Pat. Off. | 29/742 |
| 4106689 | 10/1991 | Germany | 29/742 |
| 1829131 | 7/1993 | U.S.S.R. | 29/742 |

*Primary Examiner*—Peter Vo
*Attorney, Agent, or Firm*—Oliff & Berridge

[57] ABSTRACT

An electronic-component mounting system including supporting devices each of which supports and positions an object and is movable along a reference line, mounting units which are arranged along the reference line and each of which includes a mounting device which mounts an electronic component (EC) on the object, and a moving device which moves the mounting device in a three-dimensional space, each mounting unit having a mounting area in which the mounting device mounts the EC on the object, a feeding device which feeds the supporting devices along the reference line from the mounting area of a most upstream mounting unit to the mounting area of a most downstream mounting unit, a positioning error detector which detects an error of positioning of the object with respect to each supporting device located in a waiting area where each supporting device waits for being fed by the feeding device, and a control device which controls each mounting unit so that the mounting device of each mounting unit mounts the EC, at a position corrected based on the detected positioning error, on the object supported by the supporting device fed to the mounting area of each mounting unit.

23 Claims, 21 Drawing Sheets

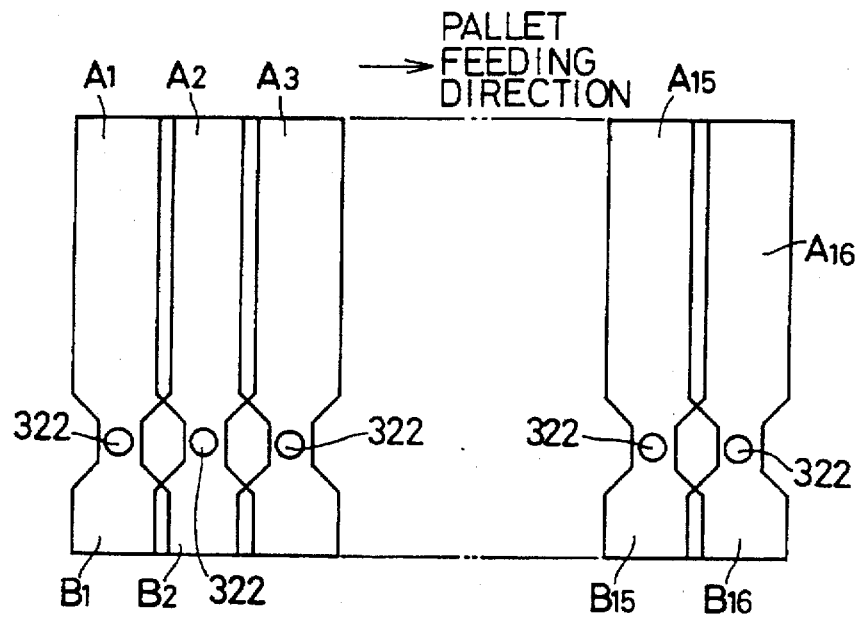
FIG.11
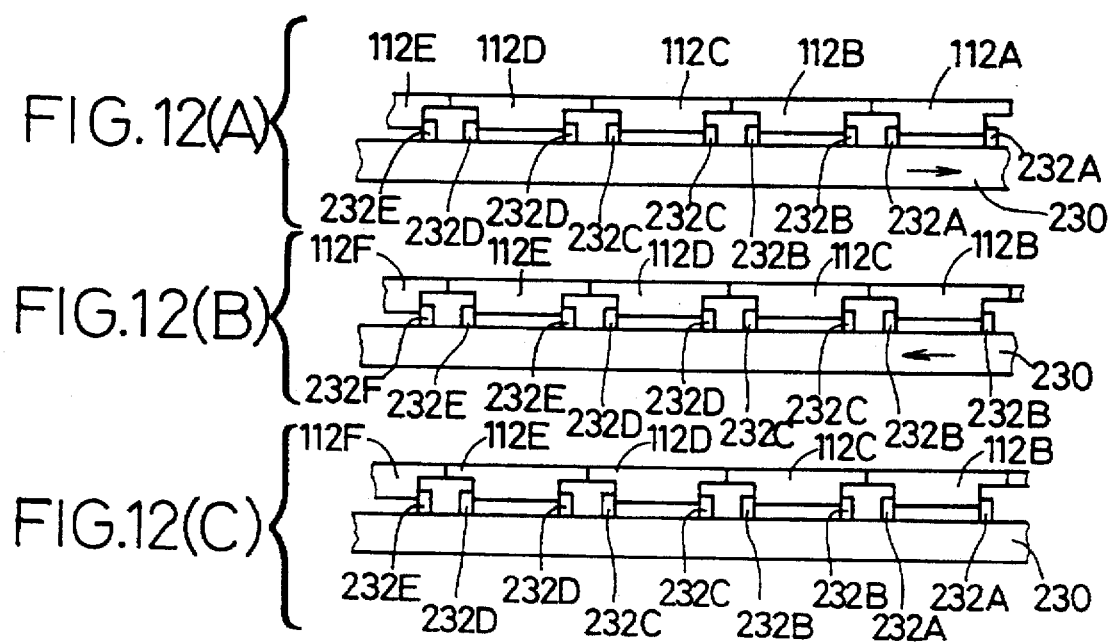

ELECTRONIC-COMPONENT MOUNTING SYSTEM

BACKGROUND OF THE INVENTION

1. Field of the Invention

The present invention relates to an electronic-component (EC) mounting system and particularly to the art of improving the accuracy of mounting of ECs on an object such as a printed circuit board (PCB).

2. Related Art Statement

There is known an EC mounting system including a plurality of EC mounting units which concurrently mount ECs on a PCB. The known EC mounting system additionally includes a feeding device which feeds PCBs. Each EC mounting unit includes an EC mounting device, and a moving device which moves the EC mounting device in a first and a second directions perpendicular to each other and each parallel to a horizontal plane and in a third direction perpendicular to the horizontal plane. The plurality of EC mounting units are arranged along a reference straight line parallel to the first direction.

The feeding device includes a plurality of supporting devices each of which supports at least one PCB, and moves each supporting device so as to draw a rectangular locus. Each supporting device includes one or more positioning pins which positions or position a PCB relative to the supporting device.

Before PCBs are supported by the supporting devices, the PCBs are supported by a support table. When each supporting device is moved up and the positioning pins of the supporting device are fit in positioning pins of each PCB, the PCB is supported from the underside thereof by, and positioned on, the supporting device. Subsequently, the PCB is lifted off the support table and, when the supporting device supporting the PCB is intermittently moved together with other supporting devices supporting PCBs, the PCBs are fed forward altogether at a predetermined feeding stitch. Each time the PCBs are intermittently stopped, the EC mounting units concurrently mount ECs on respective EC mounting sections of the PCBs which currently are located in respective EC mounting areas of the EC mounting units.

Each time the PCBs are fed by a distance equal to a length thereof, the supporting devices are moved down so that the PCBs are again supported on the support table. When the supporting devices are returned to their initial positions by the above-indicated distance, the PCBs are, therefore, not moved. When the supporting devices are again moved up at their initial positions, the supporting devices support the PCBs which include the newly added, most upstream PCB, and no longer include the PCB which had been supported in the preceding feeding cycle by the most downstream supporting device, as seen in the direction of feeding of PCBs. In other words, the supporting devices support the PCBs each of which is upstream by one PCB of a corresponding one of the PCBs which had been supported by the supporting devices in the preceding feeding cycle.

In the known EC mounting system, ECs are mounted on PCBs with accuracy based on reference marks fixed to each PCB. At a position upstream of the most upstream EC mounting unit, a new PCB having no EC mounted thereon is supported and positioned by the most upstream supporting device and waits for being fed by the feeding device. Before being fed by the feeding device to each of the EC mounting areas of the EC mounting units, respective images of the reference marks fixed to the new PCB are picked up by an image pick-up device. Based on the comparison of the thus obtained image data and the reference data pre-stored in a data memory, the errors of positioning of the PCB relative to the supporting device are calculated. The thus obtained positioning-error data are supplied to each of the EC mounting units as the PCB is fed to the EC mounting area of each EC mounting unit, so that the error data are utilized by each EC mounting unit to compensate for the PCB positioning errors by correcting an EC mounting position to which the EC mounting device of each EC mounting unit is moved to mount an EC.

However, the prior EC mounting system suffers from low accuracy of mounting of ECs on PCBs. In the known EC mounting system, each supporting device positions each PCB thereon by fitting the positioning pins thereof in the positioning holes of the PCB. However, generally, PCBs have a low rigidity, and it is difficult to form positioning holes in low-rigidity PCBs with high accuracy. In addition, the positioning pins of each supporting device are disengaged from the positioning holes of each PCB after the supporting device supporting the PCB is fed by a distance equal to a pitch of arrangement of the supporting devices, so that the positioning pins of each supporting device are engaged with the positioning holes of a PCB upstream of the PCB which had been supported by the supported device in the preceding feeding cycle. Thus, while each PCB is moved from the most upstream EC mounting area to the most downstream EC mounting area in the EC mounting system, the positioning holes of the PCB are repeatedly engaged with, and disengaged from, the positioning pins of different supporting devices. However, since the rigidity of the PCB is low as described above, portions of the PCB around the positioning holes thereof are elastically deformed when those holes are engaged with the positioning pins of different supporting devices. Thus, different positioning errors are produced when the positioning holes of each PCB are engaged with the positioning pins of different supporting devices. This is exaggerated since the different supporting devices have different positioning pins. Therefore, although the EC mounting positions may be corrected based on the PCB positioning errors obtained by picking up the images of the reference marks fixed to each PCB, the prior EC mounting system suffers from the problem of low accuracy of mounting of ECs on PCBs.

SUMMARY OF THE INVENTION

It is therefore an object of the present invention to provide an electronic-component (EC) mounting system which includes a plurality of EC mounting units and mount ECs on objects such as printed circuit boards (PCBs) with high accuracy.

The above object has been achieved by the present invention, which provides an electronic-component mounting system comprising a plurality of supporting devices each of which supports and positions at least one object, the supporting devices being movable along a reference line, a plurality of mounting units arranged along the reference line, each of the mounting units including a mounting device which mounts at least one electronic component on the object supported by the each supporting device, and a moving device which moves the mounting device in a three-dimensional space, the each mounting unit having a mounting area in which the mounting device mounts the component on the object, a feeding device which feeds the plurality of supporting devices along the reference line such that the object supported by the each supporting device is moved from the mounting area of a most upstream one of the mounting units to the mounting area of a most downstream one of the mounting units in a direction of feeding of the supporting devices, while the feeding device positions the each supporting device when the mounting device of the each mounting unit mounts the component on the object supported by the each supporting device, a positioning error detector which detects an error of positioning of the object with respect to the each supporting device located in a waiting area where the each supporting device waits for being fed by the feeding device, and a control device which controls the each mounting unit so that the mounting device of the each mounting unit mounts the component, at a position corrected based on the detected positioning error, on the object supported by the each supporting device fed to the mounting area of the each mounting unit. The feeding device may intermittently or continuously feed each supporting device from the EC mounting area of the most upstream EC mounting unit to the EC mounting area of the most downstream EC mounting unit in the feeding direction. In the case where each supporting device is intermittently fed, the feeding device may move the supporting device along a rectangular route as described above with respect to the prior EC mounting system, or may reciprocate the supporting device as will be explained in detailed description of the preferred embodiments. Otherwise, the feeding device may include a cam having a spiral ridge or groove which is rotated to feed the supporting device. In either case, ECs are mounted on PCBs while the supporting devices are stopped. On the other hand, in the case where each supporting device is continuously fed without being stopped, ECs are mounted on PCBs while the supporting devices are continuously fed. The feeding device may include a servo motor to move the supporting devices, so that the current position of each supporting device is accurately known, and the moving device of each EC mounting unit may include a servo motor to move the EC mounting device thereof, so that the current position of the EC mounting device accurately follows the current position of each supporting device. Thus, ECs are mounted on PCBs with high accuracy while the PCBs supported on the supporting devices are continuously fed.

In the EC mounting system constructed as described above, the EC mounting units mount ECs on an object such as a PCB when the object is fed to the respective EC mounting areas of the EC mounting units. While the object is moved in the feeding direction from the EC mounting area of the most upstream EC mounting unit to the EC mounting area of the most downstream EC mounting unit, all ECs are mounted on the object. The control device controls each EC mounting unit so that the EC mounting device of each EC mounting unit mounts, on the object fed to the EC mounting area thereof, an EC at a position corrected based on the positioning error detected by the positioning error detector. Thus, the EC is mounted at the corrected, EC mounting position on the object, with high accuracy. Each object is supported by a single supporting device while the object is fed from the most upstream EC mounting area to the most downstream EC mounting area. In addition, each supporting device is positioned with high accuracy at the time of mounting of ECs on PCBs, irrespective of whether the supporting devices may be fed intermittently or continuously. Thus, ECs are mounted on each PCB with high accuracy, at respective EC mounting positions corrected based on a PCB positioning error obtained in the waiting area by the positioning error detector. Each supporting device may be formed of a material having a high rigidity, and the feeding device may include a positioning device which positions with high accuracy each supporting device by one or more positioning pins thereof. In the latter case, ECs are mounted on PCBs with higher accuracy.

In a preferred embodiment of the present invention, the EC mounting system further comprises a returning device which returns the each supporting device fed by the feeding device to a downstream end of a feeding route in the direction of feeding of the supporting devices, from the downstream end to the waiting area via a returning route different from the feeding route, an unloading device which is provided on the returning route including the downstream end and the waiting area, the unloading device unloading, from the each supporting device, the object on which the respective mounting devices of the mounting units have mounted the electronic components, and a loading device which loads at least one new object on the each supporting device after the unloading device has unloaded therefrom the object on which the electronic components have been mounted. The unloading device may be provided at the downstream end of the feeding route and the loading device may be provided in the waiting area. In this embodiment, the supporting devices are returned by the returning device for being used in a circulatory fashion, and the number of the supporting devices employed is reduced.

In another embodiment of the present invention, the control device comprises means for controlling the respective mounting devices of the mounting units to concurrently mount the electronic components on the object, at positions corrected based on the detected positioning error. In this embodiment, all ECs are mounted on each object in a shorter time.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which:

FIG. 11 is a view of respective EC mounting areas, $A_1$ to $A_{16}$, of the EC mounting units of the system of FIG. 1;

FIGS. 12A–12C are a view for explaining the manner in which the pallets are engaged with the feeding projections of the transverse bar of the pallet feeding device of the system of FIG. 1;

DETAILED DESCRIPTION OF THE PREFERRED EMBODIMENTS

Figure 1:
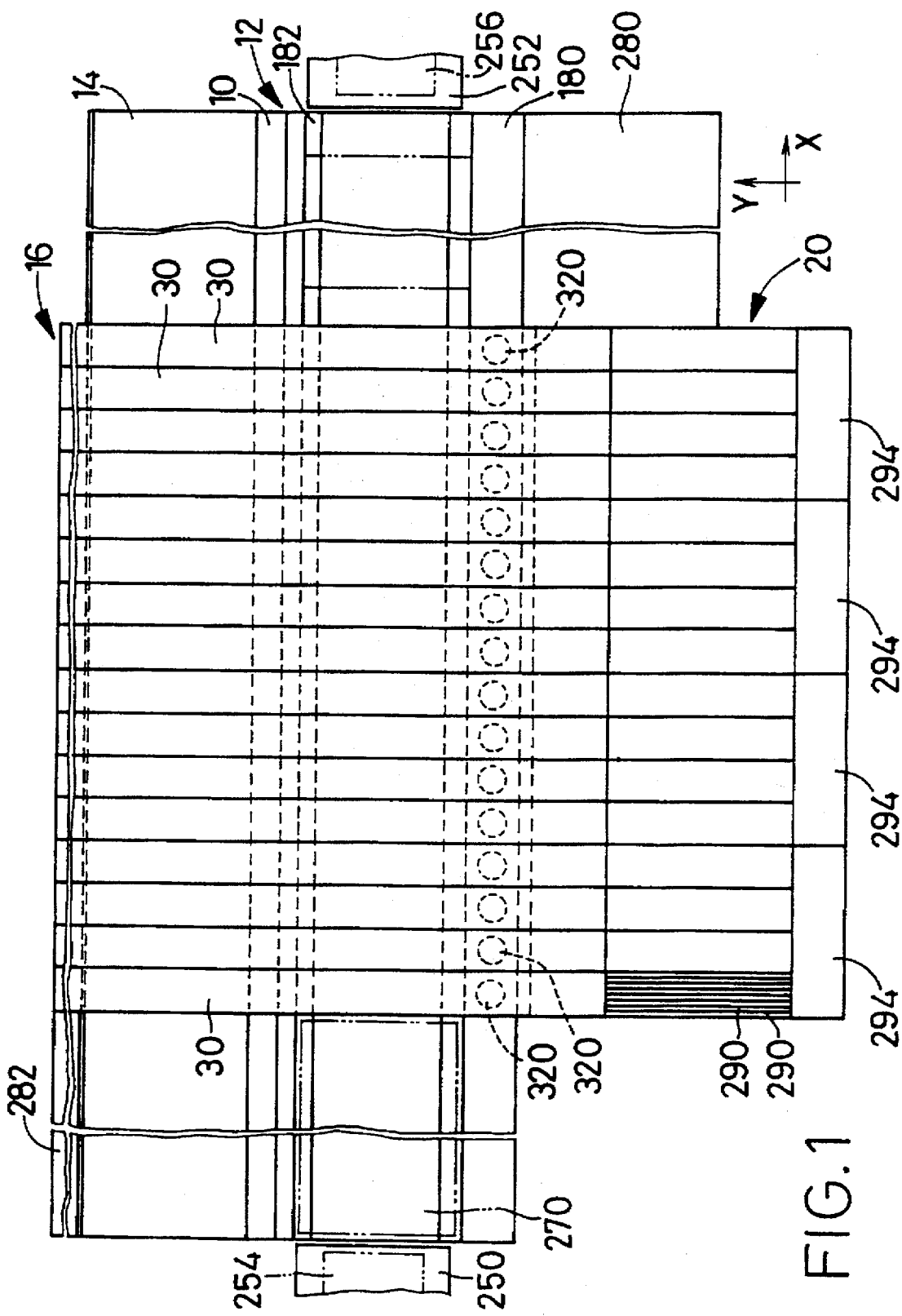
FIG. 1 is a schematic plan view of an electronic-component (EC) mounting system embodying the present invention.
Figure 2:
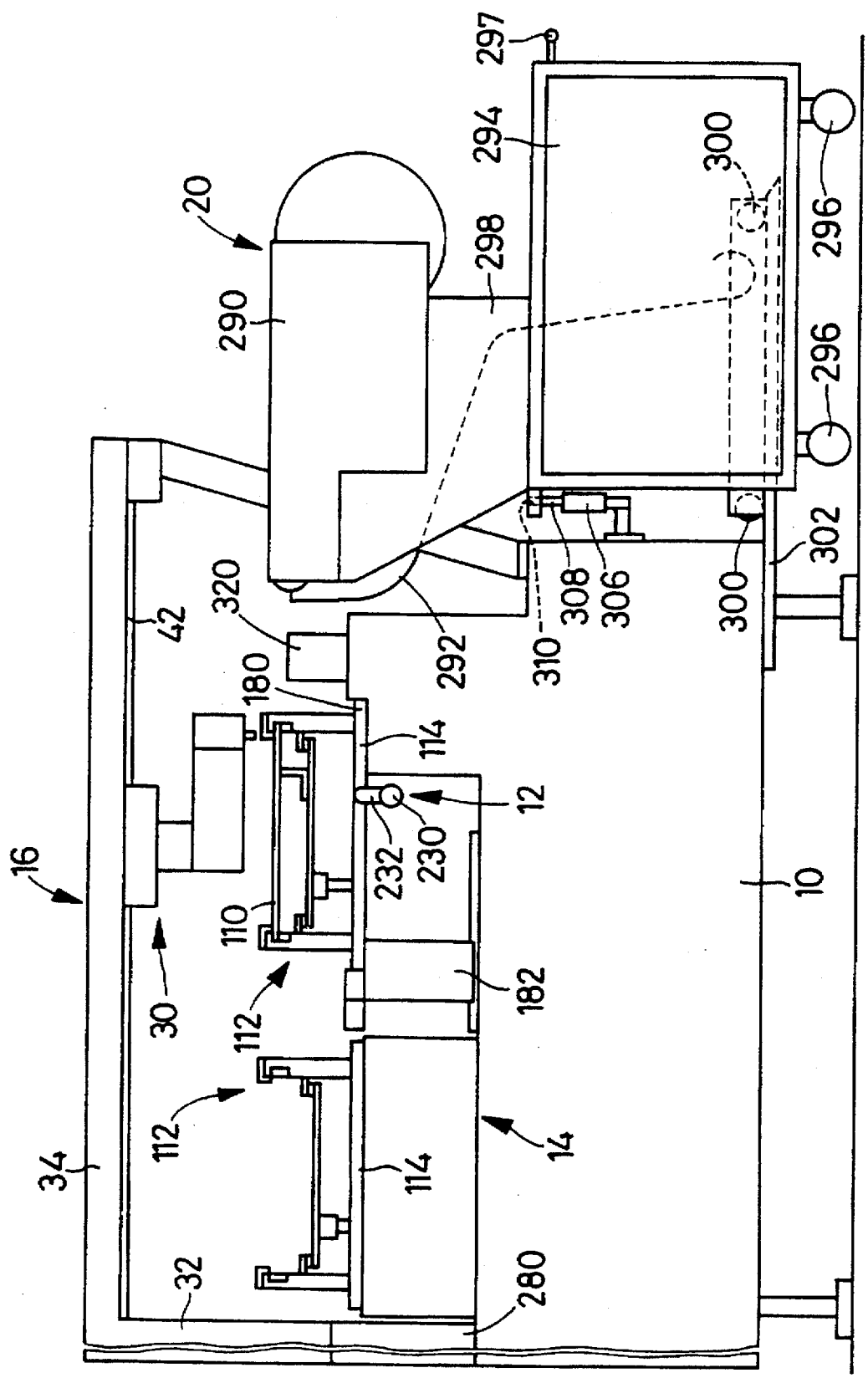
FIG. 2 is an elevation view of the EC mounting system of FIG. 1.

Referring first to FIGS. 1 and 2, there is shown an electronic-component mounting system to which the present invention is applied. The present system is for mounting electronic components (hereinafter, referred to as the "EC" or "ECs" if appropriate) on an object such as a printed circuit board ("PCB").

Reference numeral 10 designates a bed on which a pallet feeding device 12 and a pallet returning device 14 extend in an X direction parallel to a horizontal plane, indicated at arrow in FIG. 1, and are arranged side by side in a Y direction perpendicular to the X direction. An EC mounting machine 16 is provided above those devices 12, 14. An EC supplying device 20 is provided adjacent to the bed 10. Each of the elements 16, 12, 14, 20 is described in detail below.

The EC mounting machine 16 includes sixteen EC mounting units 30 which are arranged along a straight, reference line parallel to the X direction.

Figure 3:
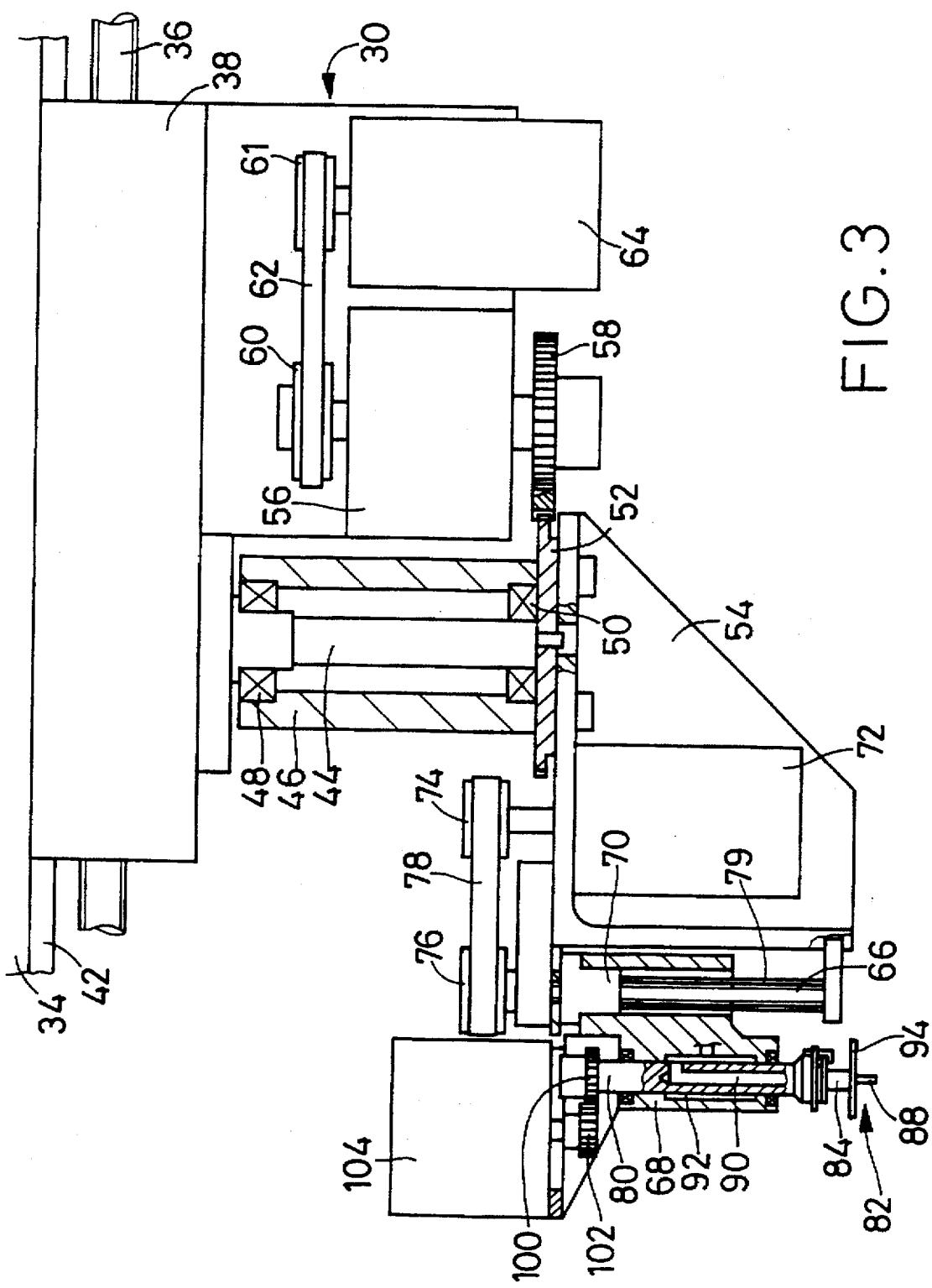
FIG. 3 is a cross-sectional elevation view of an EC mounting unit of the system of FIG. 1.

As shown in FIG. 2, each EC mounting unit 30 has a unit frame 32 fixed to the bed 10. As shown in FIG. 1, the respective unit frames 32 of the sixteen mounting units 30 are arranged side by side with substantially no clearance being provided therebetween. Each unit frame 32 includes a support portion 34 which extends parallel to the Y direction and has a length reaching the EC supplying device 20 over the pallet returning and feeding devices 14, 12. As shown in FIG. 3, a first ball screw 36 is attached to a lower surface of the support portion 34, such that the ball screw 36 extends parallel to the Y direction. A Y-direction slide member 38 is threadedly engaged with the ball screw 36. When the ball screw 36 is rotated by a Y-direction servo motor 40 (FIG. 8), the Y-direction slide 38 is moved by being guided by guide rails 42.

An axis member 44 which extends in a vertical, Z direction perpendicular to the X and Y directions, is fixed to a lower surface of the Y-direction slide 38, and a sleeve member 46 is rotatably attached to the axis member 44 via bearings 48, 50. A driven gear 52, and a base portion of a rotary arm 54 are fixed to a lower end of the sleeve 46. The driven gear 52 is engaged with a drive gear 58 fixed to an output shaft of a reduction gear unit 56, and receives rotary motion of an arm-rotating servo motor 64 via timing pulleys 60, 61, a timing belt 62, and the gear unit 56. Thus, the rotary arm 54 is rotated about an axis line thereof parallel to the Z direction.

A second ball screw 66 is attached to a free end of the rotary arm 54 such that the ball screw 66 extends parallel to the Z direction. A nut 70 to which a Z-direction slide member 68 is fixed, is threadedly engaged with the ball screw 66. The ball screw 66 receives rotary motion of a Z-direction servo motor 72 via timing pulleys 74, 76 and a timing belt 78. Thus, the Z-direction slide 68 is moved up and down by being guided by guide rails 79.

A rod member 80 is supported by the Z-direction slide 68 such that the rod 80 is rotatable about an axis line thereof parallel to the Z direction and is not movable in any directions parallel to the axis line. An EC suction device 82 is attached to a lower end of the rod 80 which projects downward from a lower surface of the Z-direction slide 68. The EC suction device 82 includes a support member 84 which is held by the rod 80 such that the support member 84 is movable parallel to the Z direction relative to the rod 80 and does not completely come out of the rod 80. A biasing spring (not shown) is provided in the rod 80 to bias the support member 84 or suction device 82 in a direction in which the support member 84 comes out of the rod 80. A suction pipe 88 is fixed to the support member 84, and is supplied with negative pressure or vacuum from a vacuum source (not shown) via a first vacuum passage 90 formed in the rod 80 and a second vacuum passage 92 formed in the Z-direction slide 68. Thus, the suction pipe 88 can hold an EC by utilizing the vacuum. A circular back plate 94 is attached to the suction pipe 88. The back plate 94 has dimensions greater than those of ECs to be held by the suction pipe 88, and has the property of absorbing light, thereby providing a black background above the EC held by the suction pipe 88.

The rod 80 is rotated by motion of a stepper motor 104 via gears 100, 102. Thus, the EC suction device 82 is rotated about an axis line thereof.

In this way, the EC suction device 82 is movable in a cubic space by the Y-direction movements of the Y-direction slide 38, the rotary movements of the rotary arm 54, and the upward and downward movements of the Z-direction slide 68. In particular, when the rotary arm 54 is rotated, the EC suction device 82 is moved in the X direction. A radius of rotation of the rotary arm 54 is pre-determined to be longer than a half of an X-direction dimension of the unit frame 32 of each EC mounting unit 30, and an angular range of rotation of the rotary arm 54 is pre-determined so that the EC suction device 82 of each EC mounting unit 30 is movable, in the X direction, into an area or space corresponding to each of the respective unit frames 32 of the two EC mounting units 30 adjacent to each EC mounting unit 30 on both sides thereof. Thus, an X-direction movement range of each EC suction device 82 partly overlaps that of each of the two EC suction devices 82 adjacent to each EC suction device 82 on both sides thereof. Therefore, as shown in FIG. 11, respective movement areas (i.e., EC mounting areas), $A_1$ to $A_{16}$, of the sixteen EC mounting units 30 partly overlap one another with respect to the X direction.

Figure 4:
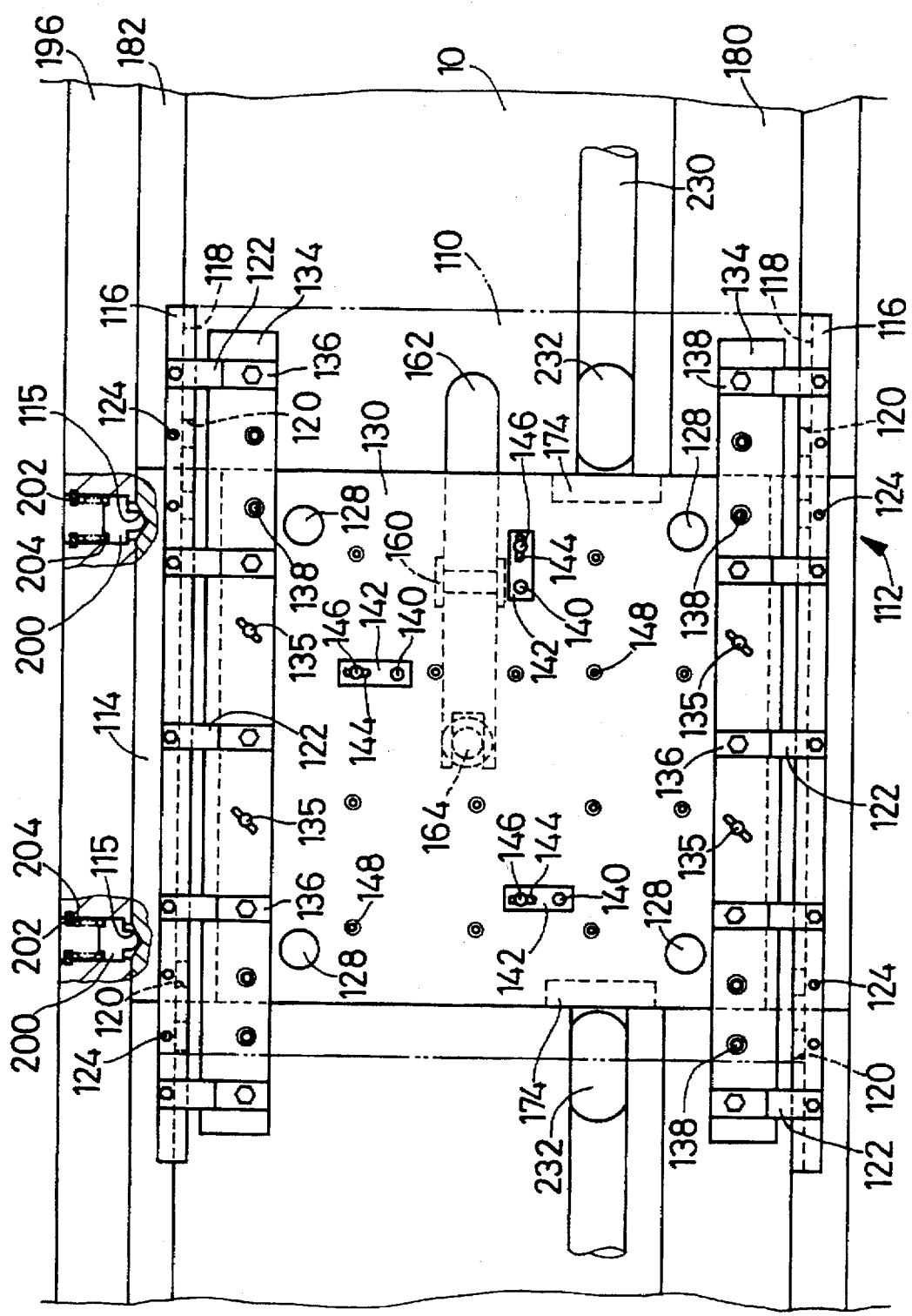
FIG. 4 is a plan view of a pallet employed in the system of FIG. 1.

Next, the pallet feeding device 12 is described. The pallet feeding device 12 feeds pallets 112 each of which supports a PCB 110. As shown in FIGS. 2 and 4, each pallet 112 includes a base table 114 which has a pair of conical notches 115 formed in one of side surfaces thereof extending parallel to the X direction which one surface is positioned on the side of the pallet returning device 14 when the pallet 112 is fed by the pallet feeding device 12. The two notches 115 are spaced from each other by a distance equal to twice a feeding pitch, P, at which the pallet 112 is intermittently fed by the pallet feeding device 12.

Figure 5:
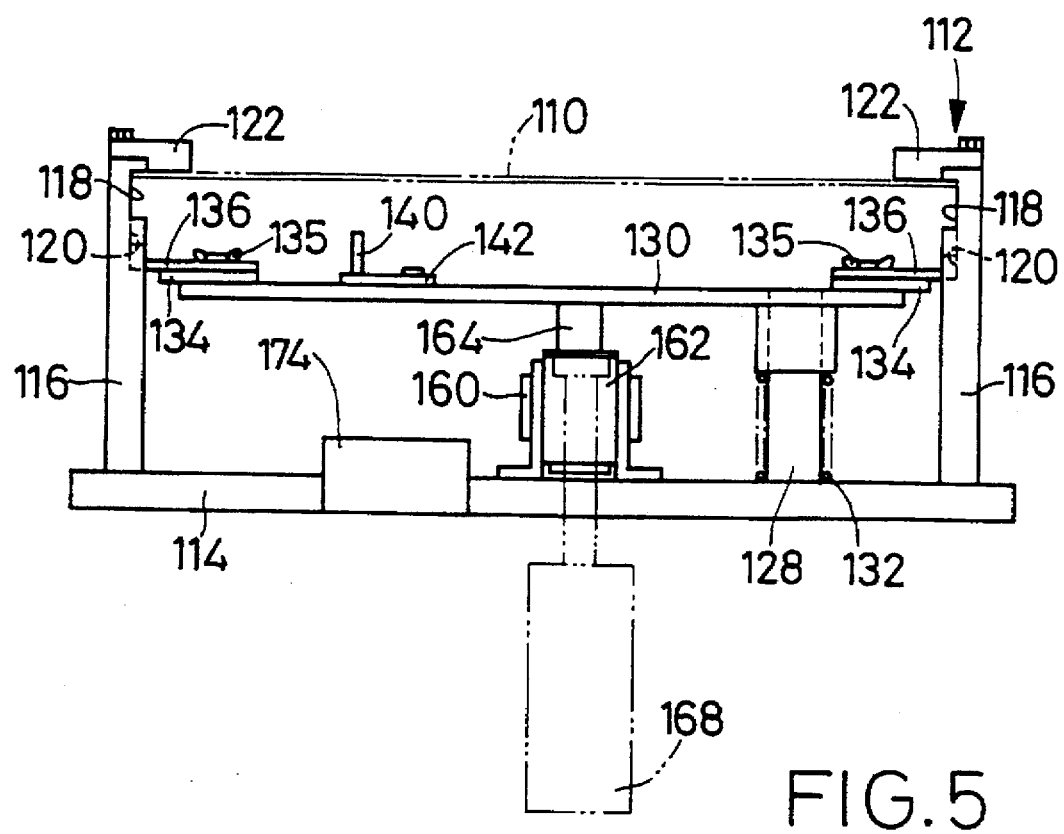
FIG. 5 is an elevation view of the pallet of FIG. 4.

As shown in FIG. 5, a pair of plate-like PCB guide members 116 are fixed to opposite edge portions of the base table 114 extending parallel to the X direction, such that the PCB guides 116 stand upright. Each PCB guide 116 has an engagement groove 118 formed in a top portion thereof. The respective engagement grooves 118 of the two PCB guides 116 open in respective inner side surfaces of the guides 116 opposed to each other, and extend parallel to the X direction. Each PCB guide 116 additionally has a plurality of engagement recesses 120 which open in a lower one of opposed side wall surfaces of a corresponding engagement groove 118 and also open in the inner side surface of the guide 116. The engagement recesses 120 of each PCB guide 116 extend vertically and are spaced from one another by an appropriate distance in the X direction.

A plurality of PCB hold-down members 122 are fixed to a top surface of each PCB guide 116. Each PCB hold-down member 122 projects from one of the PCB guides 116 toward the other PCB guide 116, such that a lower surface of the hold-down member 122 is flush with an upper one of opposed side wall surfaces of a corresponding engagement groove 118. Each PCB guide 116 has a plurality of internally threaded holes 124 which are formed at respective positions corresponding to the engagement recesses 120 and are used to fix the PCB hold-down members 122. Thus, the PCB hold-down members 122 are fixed at the respective positions corresponding to the engagement recesses 120.

Four support pins 128 are fixed to an upper surface of the base table 114 such that the support pins 128 stand upright. An elevator plate 130 is slideably fit on the support pins 128, and is biased upward by biasing springs 132 (only one 132 is shown in FIG. 5). A pair of seat plates 134 each of which is longer than the base table 114 in the X direction, are respectively fixed with wing nuts 135 to opposite edge portions of the elevator plate 130 extending parallel to the X direction. As shown in FIG. 5, a plurality of L-shaped support members 136 are fixed to an upper surface of each seat plate 134. Each seat plate 134 has a plurality of internally threaded holes 138 which are formed at respective positions corresponding to the engagement recesses 120 formed in a corresponding PCB guide 116 and are used to fix the support members 136. Thus, the support members 136 fixed to the seat plate 134 are slideably fit in the engagement recesses 120, respectively.

A number of back-up pins 140 are fixed to an upper surface of the elevator plate 130. Each back-up pin 140 stands upright on a plate-like base member 142, which has an elongate hole 144 and is fixed to the elevator plate 130 with a screw 146 being engaged with the hole 144. The back-up pins 140 cooperate with one another to support the PCB 110 on top ends thereof and prevent a downward-convex curving or bending of the PCB 110. In addition, the back-up pins 140 bears on the underside of the PCB 110 when ECs are mounted thereon.

The elevator plate 130 has a number of internally threaded holes 148 which are formed at respective lattice points and are used to fix the base members 142, respectively. Thus, depending upon the current sort and/or size of PCBs 110, the back-up pins 140 can be adjusted or removed to appropriate positions, respectively. In addition, with the screw 146 being loosened off the elongate hole 144, each base member 142 can be moved relative to the screw 146, or can be rotated about the screw 146, so that a corresponding back-up pin 140 can be adjusted to an appropriate position. In the case where a lower surface of the PCB 110 is uneven, for example, where the PCB 110 is designed such that ECs are to be mounted on both the opposite major surfaces thereof and ECs have been mounted on the lower surface thereof, the respective positions of the back-up pins 140 can be selected and/or adjusted so that the back-up pins 140 support the lower surface of the PCB 110 at positions where no ECs or no other projections are present.

The elevator plate 130 is engaged with a yoke-shaped end of a lever 162 which is rotatably attached to the base table 114 via an axis member 160. The yoke-shaped end of the lever 162 is engaged with a small-diameter portion of a stepped engagement member 164 fixed to a lower surface of the elevator plate 130. The other end of the lever 162 extends outwardly of the base table 114 toward a downstream side of the same 114 as seen in a direction of feeding of the pallets 112 by the pallet feeding device 12. The lever 162 can be rotated by one of first air cylinders 168 (FIG. 8) which are provided in a waiting area and at a PCB unloading position each of which will be described later, so that the elevator plate 130 is moved downward against the biasing forces of the biasing springs 132. When the elevator plate 130 is moved up and down, the support members 136 are also moved up and down to selectively be placed in a first state in which the support members 136 press a PCB 110 against the upper side wall surfaces of the engagement grooves 118 and in a second state in which the support members 136 are retracted into the engagement recesses 120 and permit a PCB 110 to enter the engagement grooves 118.

The PCB hold-down members 122 are fixed at respective positions corresponding to the positions where the support members 136 of each PCB guide 116 are fit in the engagement recesses 120. The support members 136 support the PCB 110 on the underside thereof, and the PCB hold-down members 122 hold down the PCB 110 at respective locations thereof nearer to a center thereof than locations thereof at which the support members 136 support the PCB 110. Thus, the PCB hold-down members 136 prevent an upward-convex curving or bending of the PCB 110.

As shown in FIG. 4, two engagement plates 174 are fixed to two positions on the base table 114 which are remote from each other in the X direction. The engagement plates 174 are formed of a material having a high wear resistance (hereinafter, referred to as the "wear-resistant" material), such as SK steels (i.e., carbon tool steels) and SCM steels (i.e., chrome molybdenum steels), and has a high wear resistance. The other portions of the pallet 12 than the engagement plates 174 are formed of aluminum, and the overall weight of the pallet 12 is reduced.

Different sorts of pallets 112 having different sizes may be employed corresponding to different sorts of PCBs 110 having different sizes. It is assumed that the pallets 112 (strictly, PCB guides 116) employed in the present embodiment have an X-direction dimension four times as great as the feeding pitch P and that the PCBs 110 have an X-direction dimension smaller than that of the PCB guides 116. Different sorts of PCBs 110 which, however, have the same size may be fed by using the same pallets 112. In the latter case, the positions of the hold-down members 122, support members 136, and/or back-up pins 140 may be changed to appropriate ones corresponding to each sort of PCBs 110.

The support members 136 and seat plates 134, as a unit, can be replaced with another unit. The positions of the hold-down members 122 where the members 122 are fixed to each PCB guide 116, can be changed depending upon the sort of the PCBs 110. Otherwise, in the case where the PCB guides 116 are detachably attached to the base table 114, the hold-down members 122 and PCB guides 116, as a unit, can be replaced with another unit. Moreover, it is possible to adapt the pallets 112 such that the support members 136, back-up pins 140, and elevator plate 130, as a unit, can be replaced with another unit. Furthermore, in the case where the PCB guides 116 are provided on the base table 114 such that the positions of the guides 116 can be changed or adjusted, the positions of the guides 116 can be adjusted depending upon the size of the PCBs 110. In the last case, the elevator plate 130 can be replaced with another, depending upon the size of the PCBs 110.

As shown in FIGS. 1 and 2, the bed 10 includes a fixed guide 180 and a movable guide 182 for guiding the pallets 112 being fed. The fixed guide 180 is located on the side of the EC supplying device 20, and the movable guide 182 is located on the side of the pallet returning device 14. As shown in FIG. 1, the two guides 180, 182 extend upstream (i.e., in the left-hand direction in the figure) and downstream (i.e., in the right-hand direction) from the range of the EC mounting machine 16 with respect to the pallet feeding direction. Thus, the two guides 180, 182 enable each pallet 112 to wait in the waiting area before entering the X-direction range of the EC mounting machine 16 and to move over the range the same 16 toward the PCB unloading position.

Figure 7:
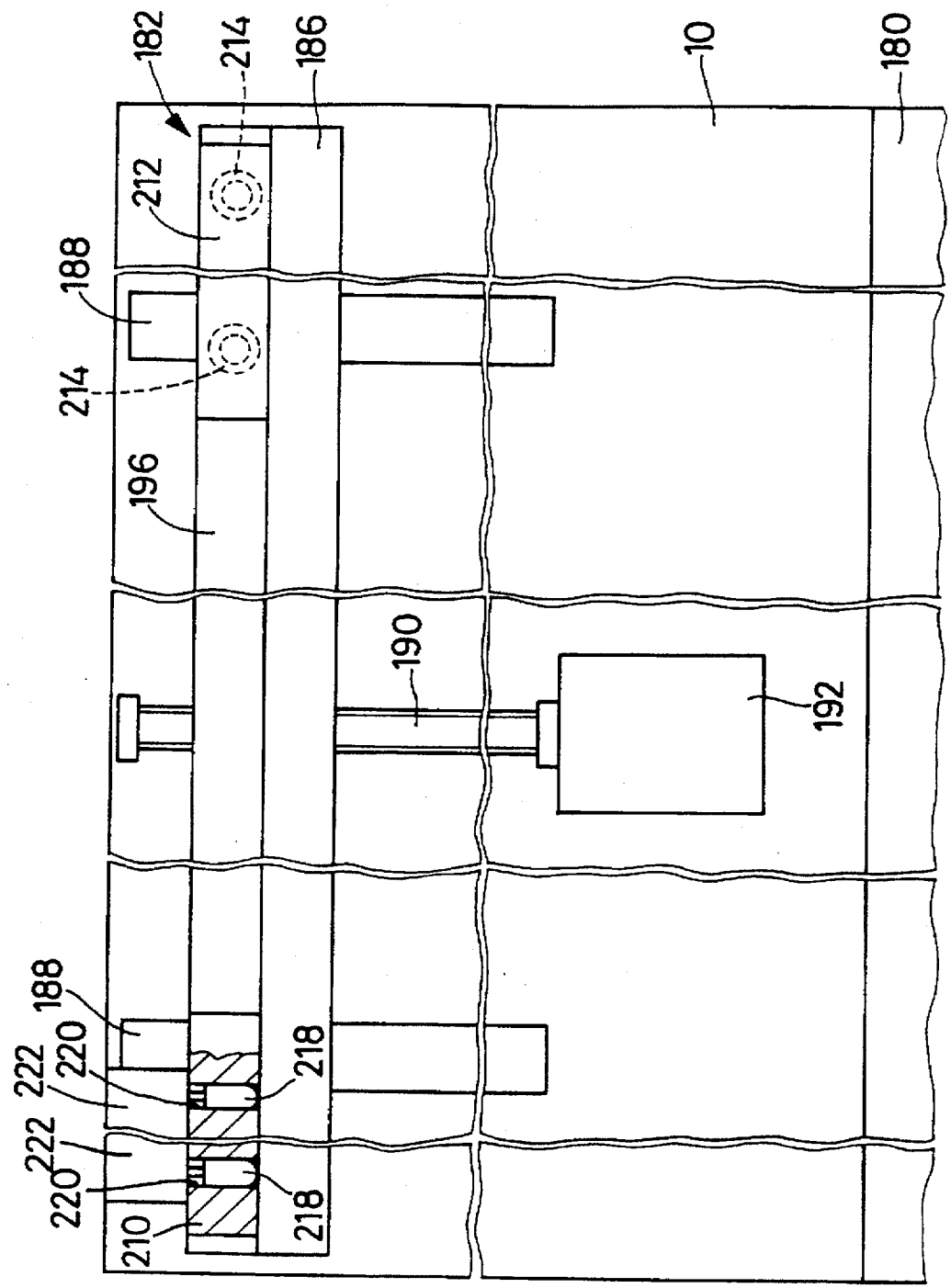
FIG. 7 is a plan view of a fixed and a movable guide member as parts of a pallet guiding device of the system of FIG. 1.

As shown in FIG. 7, the movable guide 182 includes a base member 186 which is movable in the Y direction. The base member 186 is slideably fit on a pair of guide rails 188 provided on the bed 10, and is threadedly engaged with a ball screw 190. When the ball screw 190 is rotated by a width-adjusting servo motor 192, the base member 186 is moved toward, and away from, the fixed guide 180, so that the width or distance between the two guides 180, 182 is adjusted.

A guide wall 196 for guiding one side surface of the base table 114 of each pallet 112, stands upright on a part of the base member 186 of the movable guide 182 which part corresponds to the range of the EC mounting machine 16 in the X direction. As shown in FIG. 4, a plurality of positioning pins 200 for positioning the pallets 112 in the X direction are provided in the guide wall 196 at the same pitch as the feeding pitch P. Each positioning pin 200 is slideably fit in a stepped hole 202 which is formed through a thickness of the guide wall 196 in the Y direction. A biasing spring 204 biases the pin 200 in a direction in which a free end of the pin 200 projects from the guide wall 196.

As shown in FIG. 7, two elevator guides 210, 212 are provided on respective portions of the base member 186 of the movable guide 182 which correspond to the upstream and downstream sides of the EC mounting machine 16 with respect to the pallet feeding direction. The elevator guides 210, 212 are attached to the base member 186 such that each elevator guide 210, 212 can be moved up and down. As illustrated with respect to one elevator guide 212 only, each elevator guide 210, 212 is moved up and down by a pair of air cylinders 214 provided in the base member 186 of the movable guide 182. The elevator guides 210, 212 guide, when being held at an uppermost position thereof, the pallets 112 being fed in the X direction and permit, when being held at a lowermost position thereof where respective upper surfaces of the guides 210, 212 are lower than an upper surface of the base member 186, the pallets 112 to be moved in the Y direction.

A plurality of positioning pins 218 are provided in each of the upstream-side and downstream-side elevator guides 210, 212. As shown with respect to the upstream-side elevator guide 210 only, a plurality of through holes 220 each of which extends in the Y direction are formed at respective positions spaced by respective distances equal to respective products of the feeding pitch P and respective integral numbers from the most upstream (or downstream) one of the stepped holes 202 formed in the guide wall 196. Each positioning pin 218 is slideably fit in a corresponding through hole 220, and is selectively moved by a third air cylinder 222 to an operative position thereof where the pin 218 projects from the elevator guide 210, 212 and to an inoperative position thereof where the pin 218 is retracted into the guide 210, 212.

Figure 6:
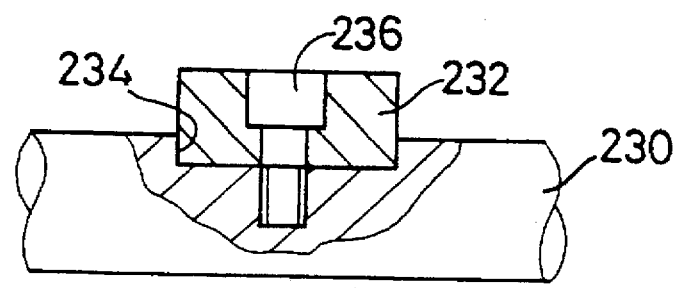
FIG. 6 is a partly cross-sectional, elevation view of a transverse bar and a feeding projection as parts of a pallet feeding device of the system of FIG. 1.

A transverse bar 230 is provided between the fixed and movable guides 180, 182 of the bed 10, and extends parallel to the X direction. As shown in FIG. 4, the transverse bar 230 has a plurality of pairs of feeding projections 232 fixed thereto. As shown in FIG. 6, each feeding projection 232 is fit in a recess 234 formed in the transverse bar 230 and fixed to the bar 230 with a bolt 236. Each pair of projections 232 are fixed to the bar 230 such that the two projections 232 are spaced from each other by a distance slightly greater than a dimension of the base table 114 of each pallet 112 as measured in the X direction. A pitch at which the pairs of projections 232 are arranged, that is, a distance between a middle position of each pair of projections 232 and a middle position of a pair of projections 232 adjacent to each pair of projections 232 is equal to a product of the pallet feeding pitch P and an integral number. The feeding projections 232 are formed of a wear-resistant material, like the previously-described engagement plates 174.

The transverse bar 230 is engaged with a feeding member (not shown) such that the bar 230 is rotatable about an axis line thereof, and is not movable along the axis line, relative to the feeding member. The bar 230 can be moved in a forward and a backward direction parallel to the X direction by a pallet-feeding servo motor 240 (FIG. 8) via the feeding member. The bar 230 is intermittently moved at the feeding pitch P in the pallet feeding direction from the waiting area to the PCB unloading position, so that the bar 230 is moved by a distance equal to the pitch of arrangement of the feeding projections 232. In the present embodiment, the feeding pitch P is equal to a pitch of arrangement of the sixteen EC mounting units 30. Hereinafter, the movement of the bar 230 in the forward direction by the distance equal to the pitch of arrangement of the projections 232 is referred to as "one feeding cycle". After the bar 230 has been moved in one feeding cycle, the bar 230 is moved in the backward direction by a distance corresponding to one feeding cycle, at once.

The transverse bar 230 can be rotated in opposite directions, each by 90 degrees, by a bar-rotating device 244

Figure 8:
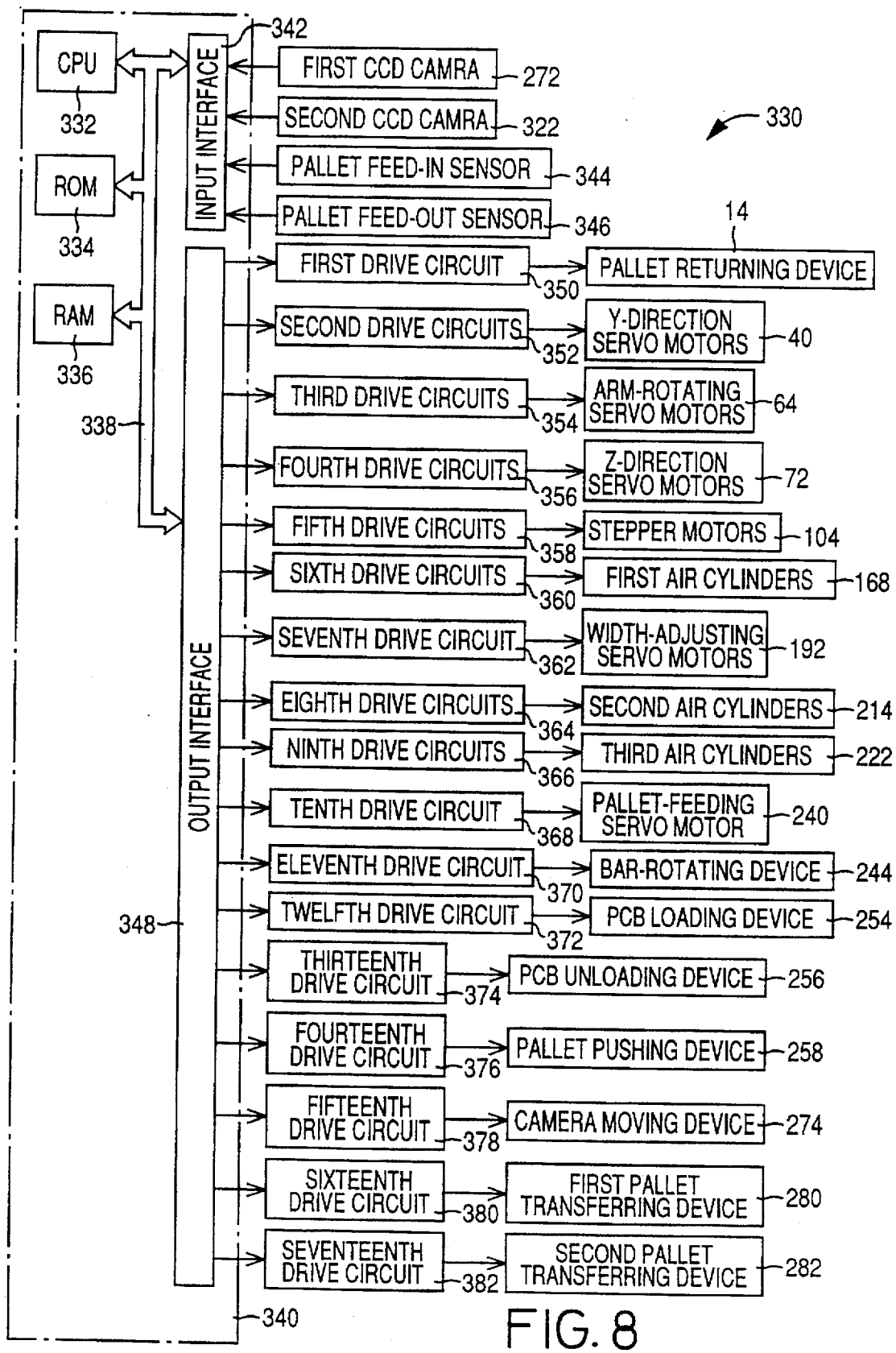
FIG. 8 is a diagrammatic view of a control device of the system of FIG. 1.

(FIG. 8). Thus, the bar 230 is selectively placed in an operative position thereof where the feeding projections 232 project upward and are engaged with the pallets 112 and in an inoperative position thereof where the projections 232 project horizontally and are disengaged from the pallets 112.

Each pair of feeding projections 232 placed in the operative position cooperate with each other to sandwich the base table 114 of one pallet 112. In this situation, the bar 230 is intermittently moved at the feeding pitch P, so that the pallets 112 are intermittently moved altogether at the feeding pitch P.

Figure 10:
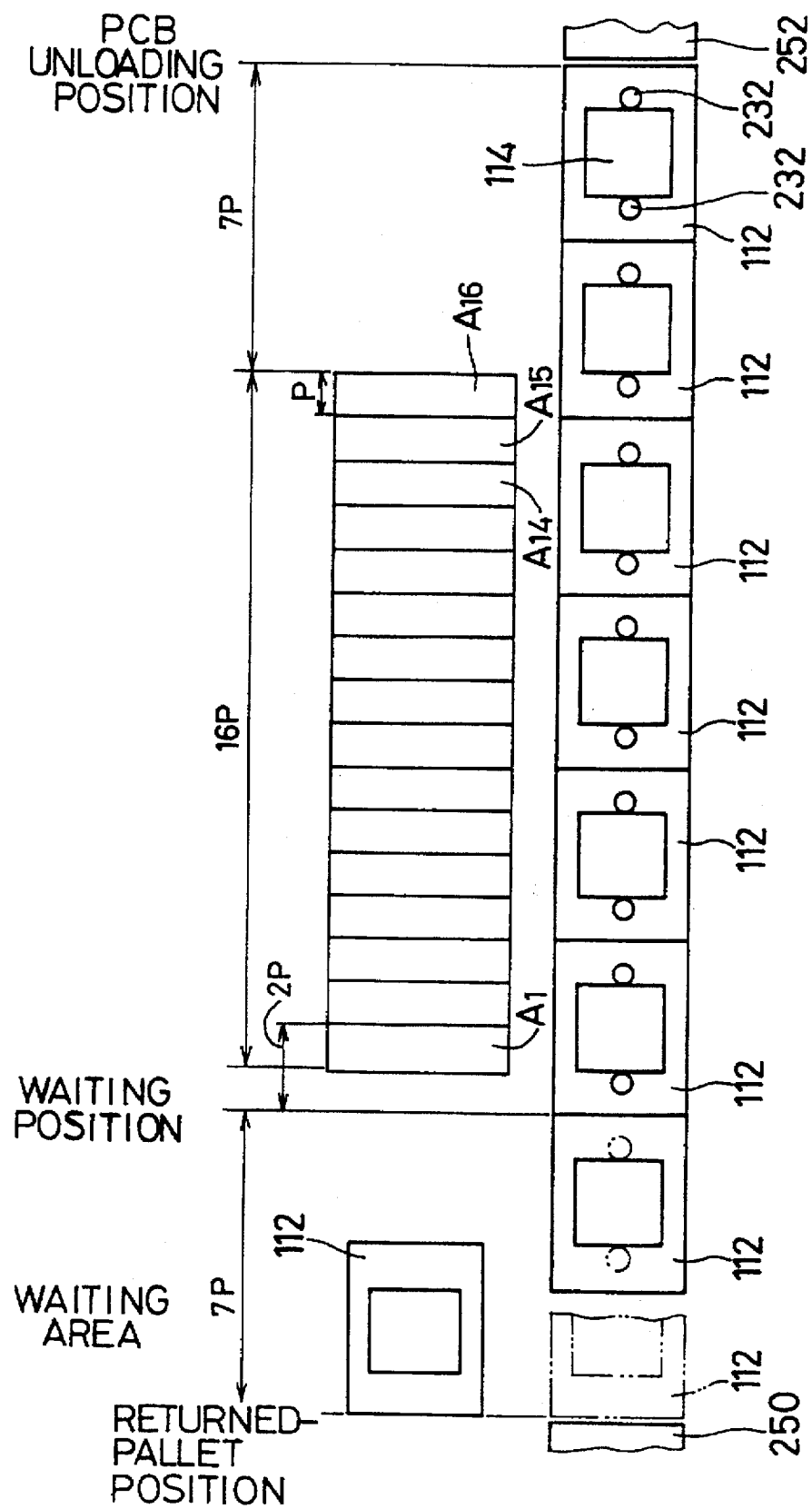
FIG. 10 is a view for explaining the manner in which the pallets are fed by the pallet feeding device of the system of FIG. 1.

The pallet feeding device 12 feeds each pallet 112 from a waiting position on the upstream side of the EC mounting machine 16 to the PCB unloading position on the downstream side of the same 16. As shown in FIG. 10, the PCB unloading position is located remote from a downstream-side end of the most downstream EC mounting area $A_{16}$ by a distance equal to seven feeding pitches, 7P, so as to be able to unload the largest pallets 112 that are employed in the present EC mounting system and have an X-direction dimension equal to seven feeding pitches 7P. A stopper (not shown) is provided at the PCB unloading position. In FIG. 10, the pallets 112 are illustratively shown, and the EC mounting areas $A_1$ to $A_{16}$ are indicated at lines corresponding to respective downstream-side ends thereof. However, a line indicating an upstream-side end of the most upstream EC mounting area $A_1$ represents an upstream-side end of the unit frame 32 of the most upstream EC mounting unit 30.

The waiting position is located remote by twice the feeding pitch P from a downstream-side end of the most upstream EC mounting area $A_1$ out of the sixteen EC mounting areas $A_1$ to $A_{16}$, and a stopper (not shown) is provided there. Thus, the waiting position is provided adjacent to the most upstream EC mounting area $A_1$, so that the present EC mounting system enjoys a shortened X-direction dimension. The fixed and movable guides 180, 182 extend by seven feeding pitches 7P on the downstream side of the EC mounting machine 16 and extend by about eight feeding pitches 8P on the upstream side of the same 16. The waiting area corresponds to seven feeding pitches P as measured from the waiting position.

A number, and a pitch of arrangement, of the pallets 112 fed by the pallet feeding device 12, and a number, and a pitch of arrangement, of the feeding projections 232 are prescribed such that when the most downstream pair of projections 232 are returned by the distance corresponding to one feeding cycle after the transverse bar 230 has fed a pallet 112 to the PCB unloading position, those projections 232 engage the next pallet 112 adjacent to that "one" pallet 112 and on the upstream side of the same, and such that the most upstream pair of projections 232 engage a pallet 112 positioned at the waiting position. The number and pitch of the projections 232 may change depending upon the distance between the waiting and unloading positions and the X-direction dimension of the pallets 112. Whichever size the pallets 112 may have, each pallet 112 positioned at the waiting position is engaged with the most upstream pair of projections 232 which have been returned by the feeding bar 230. In the embodiment shown in FIG. 10, sixteen feeding cycles are needed for each pallet 112 to pass through the sixteen EC mounting units 30. A distance between the waiting and unloading positions is equal to twenty four feeding pitches 24P; the pitch of the projections 232 is equal to four feeding pitches 4P; the bar 230 has six pairs of projections 232; and the pallet feeding device 12 simultaneously feeds six pallets 112.

A plurality of sorts of transverse bars 230 having different numbers of projections 232 provided at different pitches are used corresponding to a plurality of sorts of pallets 112 having different dimensions, and are changed with one another depending upon the size of the pallets 112 being used. Even when different transverse bars 230 are changed, the pallet-feeding servo motor 240 is not changed and is controlled by a control device 330 (described later) so as to feed each of the different bars 230 at a corresponding feeding pitch and return the same 230 in a corresponding feeding cycle.

A PCB feed-in conveyer 250 and a PCB feed-out conveyer 252 are provided adjacent to the upstream-side ends of the fixed and movable guides 180, 182 and the downstream-side ends of the same 180, 182, respectively. A PCB loading device 254 and a PCB unloading device 256 are provided above the PCB feed-in and feed-out conveyers 250, 252, respectively. The PCB loading device 254 loads a PCB 110 on each pallet 112, and the PCB unloading device 256 unloads the PCB 110 from each pallet 112. The loading and unloading devices 254, 256 enter into the waiting area and the PCB unloading position, respectively, so as to load and unload the PCB 110 on and from each pallet 112. Thus, the loading and unloading devices 254, 256 can be said to be provided in the waiting area and at the unloading position, respectively.

Each of the PCB loading and unloading devices 254, 256 includes an air cylinder (not shown) having a piston rod to a free end of which an engagement member (not shown) is attached. Each air cylinder is moved up and down by an elevator device (not shown), so that when a PCB 110 is loaded on each pallet 112, the air cylinder is moved down and the engagement member is engaged with the PCB 110 and the piston rod is advanced and/or retracted to move the PCB 110.

A pallet pushing device 258 (FIG. 8) is provided below respective portions of the fixed and movable guides 180, 182 which extend on the upstream side of the EC mounting machine 16. The pallet pushing device 258 pushes a pallet 112 into a position located between the waiting position and the PCB feed-in conveyer 250.

A reference-mark pick-up device 270 is provided above respective portions of the fixed and movable guides 180, 182 which constitute the waiting area. The pick-up device 270 picks up respective images of two reference marks provided on each PCB 110, and includes a first CCD camera 272 (FIG. 8) which is moved by a camera moving device 274 (FIG. 8) to desired positions in a horizontal plane to pick up the reference marks.

The pallet returning device 14 includes a chain conveyer and a feeding plate attached to a chain of the conveyer, and extends from the range of the EC mounting machine 16 on the upstream and downstream sides thereof as seen in the pallet feeding direction, like the fixed and movable guides 180, 182. A pallet returning route is provided by (a) a route in which the pallets 112 are fed by the pallet returning device 14, (b) a downstream end of the pallet feeding device 12, and (c) the waiting area. The pallet returning route and a route in which the pallet feeding device 12 feeds the pallets 12 through the sixteen EC mounting units 30, cooperate with each other to provide a closed, pallet circulating route.

The pallet returning device 14 returns each pallet 112 to a returned-pallet position adjacent to the waiting area as seen in the Y direction. The returned-pallet position is defined by a stopper (not shown). In the present embodiment, as shown in FIG. 10, the returned-pallet position is located upstream of the waiting position by seven feeding pitches 7P.

As shown in FIG. 2, a first pallet transferring device 280 which transfers each pallet 112 to the pallet returning device 14, is provided opposite to the pallet returning device 14 with respect to the PCB unloading position as seen in the Y direction. In addition, a second pallet transferring device 282 which transfers each pallet 112 returned by the pallet returning device 14, onto the fixed and movable guides 180, 182, is provided opposite to the waiting area with respect to the pallet returning device 14 as seen in the Y direction. Each of the transferring devices 280, 282 includes an air cylinder, and a transferring member which has two engagement portions located at respective positions spaced from each other in the X direction and can be moved by the air cylinder in the Y direction. With the two engagement portions of the transferring member being engaged with two portions of each pallet 112 spaced from each other in the X direction, the air cylinder pushes the transferring member in the Y direction, so that each pallet 112 is moved straightly in the Y direction.

Next, there will be described the EC supplying device 20. The EC supplying device 20 includes a number of EC supplying cartridges 290 arranged in the X direction as shown in FIG. 1. Each cartridge 290 supplies an EC carrier tape which includes an EC accommodating tape 292 (FIG. 2) having a number of EC accommodating pockets equidistant from one another in which ECs are accommodated, and a cover film adhered to an upper surface of the accommodating tape 292 to close respective openings of the EC accommodating pockets. Thus, the ECs are prevented from jumping out of the EC accommodating pockets of the carrier tape, when the carrier tape is fed by each EC supplying cartridge 290. The carrier tape is intermittently fed at a predetermined feeding pitch in the Y direction and is moved to an EC supplying position, while the cover film is removed from the EC accommodating tape 292.

Each EC supplying cartridge 290 has a small width (i.e., small dimension as measured in the X direction). Thus, a group of cartridges 290 (e.g., eight in the present embodiment) are provided within a range corresponding to a width of the unit frame 32 of each EC mounting unit 30. Four groups of cartridges 290 for four EC mounting units 30, respectively, i.e., thirty two cartridges 290 in total rest on each cart 294. In the present embodiment, four carts 294 are employed.

Each cart 294 has a box-like structure and rests on four casters 296. A worker can move the cart 294 by holding a handle 297 and pushing the same 294. A cartridge support table 298 is provided on each cart 294, and the EC supplying cartridges 290 are attached to the support table 298. The EC accommodating tape 292 from which the ECs have been taken, is gathered into a space inside the box cart 294, so that the tape 292 is prevented from being scattered. The tape 292 collected in the box cart 294 is cut off by the worker.

A pair of engagement rollers 300 is attached to each of opposite side surfaces of each cart 294. One of each pair of rollers 300 is attached to a front portion of the cart 294 and the other roller 300 is attached to a rear portion of the cart 294, such that a center of gravity of the cart 294 is located between the front and rear portions thereof. When each cart 294 on which the EC supplying cartridges 290 are mounted approaches the bed 10, the two pairs of rollers 300 ride on support rails 302 extending from the bed 10, so that the cart 294 is slightly lifted up from a surface of a floor.

A positioning pin 308 which can be moved up and down by an air cylinder 306 is provided on a side surface of the bed 10. With the movement of each cart 294 being inhibited by a stopper (not shown), the positioning pin 308 is fit in a positioning hole 310 formed in the cart 294. Thus, each cart 294 is attached to the bed 10 such that the cart 294 is securely positioned relative to the bed 10.

The bed 10 has, for each cart 294, two positioning pins 308 at two locations apart from each other in the X direction, and each cart 294 has two positioning holes 310 at two locations apart from each other in the X direction. One of the holes 310 has a circular cross section and the other hole 310 has an elliptic cross section, so that a difference or error between the distance of the two pins 308 and the distance of the two holes 310 is accommodated or absorbed.

As shown in FIG. 1, there are provided sixteen held-EC-posture pick-up devices 320 between the pallet feeding device 12 and the EC mounting machine 16. Each pick-up device 320 takes an image of the posture of EC held by a corresponding EC suction device 82. Each pick-up device 320 includes a second CCD camera 322 (FIG. 8) and a circular light (not shown) provided around the CCD camera 322, and takes an image of a bottom of EC held by the EC suction device 82. Since the back plate 94 provided as the black background of the EC suction device 82 absorbs the light emitted by the circular light of each pick-up device 320, the pick-up device 320 can take a clear bottom image of the EC held by the suction device 82.

It is possible to employ, for ECs having different sizes, CCD cameras 322 having different visual fields and/or different resolving powers. This may be done, e.g., in the case where each EC mounting unit 30 is adapted to mount ECs having a specific size and a CCD camera 322 having a resolving power suitable for the specific size is employed in association with that mounting unit 30.

The present EC mounting system is controlled by a control device 330 shown in FIG. 8. The control device 330 is essentially provided by a computer 340 including a central processing unit (CPU) 332, a read only memory (ROM) 334, a random access memory (RAM) 336, and bus 338 connecting the elements 332, 334, 336 to one another. An input interface 342 is connected to the bus 338, and the first and second CCD cameras 272, 322, a pallet feed-in sensor 344, and a pallet feed-out sensor 346 are connected to the input interface 342.

Additionally, an output interface 348 is connected to the bus 338. The output interface 348 is connected via first to seventeenth drive circuits 350, 352, 354, 356, 358, 360, 362, 364, 366, 368, 368, 370, 372, 374, 376, 378, 380, 382 to the pallet returning device 14, the Y-direction servo motors 40, the arm-rotating servo motors 64, the Z-direction servo motors 72, the stepper motors 104, the first air cylinders 168, the width-adjusting servo motor 192, the second and third air cylinders 214, 222, the pallet-feeding servo motor 240, the bar-rotating device 244, the PCB loading device 254, the PCB unloading device 256, the pallet pushing device 258, the camera moving device 274, and the first and second pallet transferring devices 280, 282, respectively. The ROM 334 stores various control programs needed for the present EC mounting system to mount ECs on PCBs.

Figure 9:
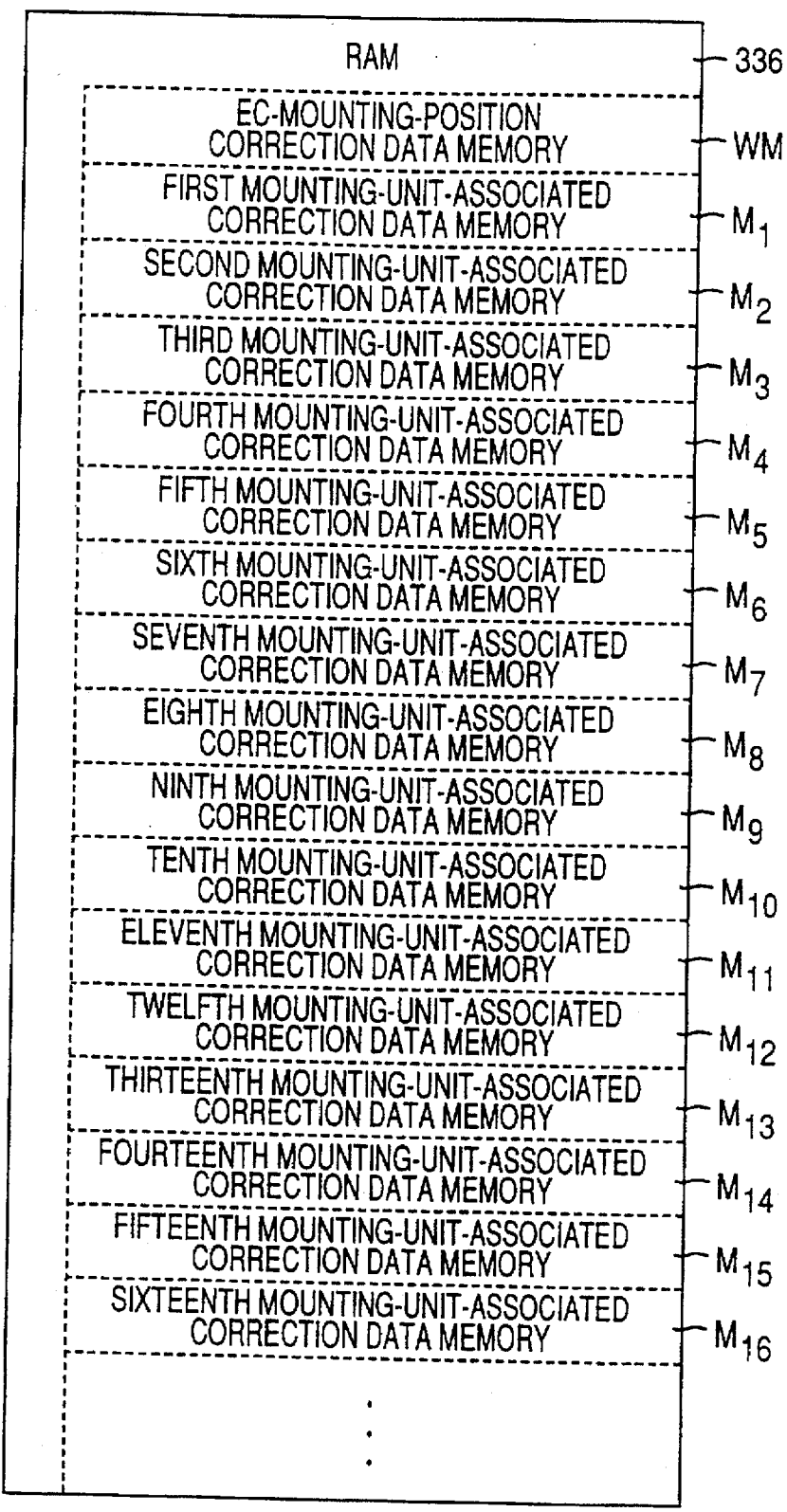
FIG. 9 is an illustrative view of a random access memory (RAM) of the control device of FIG. 8.

As shown in FIG. 9, the RAM 336 includes an EC-mounting-position correction data memory, WM, and sixteen mounting-unit-associated correction data memories, $M_1$ to $M_{16}$. The memory WM stores EC-mounting-position correction data indicative of correction values to correct all predetermined EC mounting positions where ECs are to be mounted on a PCB 110. The correction values for the EC mounting positions are determined based on positioning errors of each PCB 110 relative to a pallet 112 supporting the PCB 110. The positioning errors of the PCB 110 relative to the pallet 112 are detected in the waiting area in a manner described later. Each of the sixteen mounting-unit-associated memories $M_1$ to $M_{16}$ receives and stores the correction data originally supplied from the master memory WM, for a corresponding one of the sixteen EC mounting units 30 to mount, based on the correction data, ECs on each PCB 110 entering a corresponding one of the sixteen EC mounting areas $A_1$ to $A_{16}$.

Next, there will be described the operation of the present EC mounting system.

The six pallets 112 which support respective PCBs 110 and are respectively engaged with the six pairs of feeding projections 232 are intermittently fed altogether at the feeding pitch P by the transverse bar 230, so that each PCB 110 is sequentially fed to each of the respective EC mounting areas $A_1$ to $A_{16}$ of the sixteen EC mounting units 30 where ECs are mounted on each PCB 110. Each time the pallets 112 are fed by one feeding pitch P, the pallets 112 are positioned by the positioning pins 200.

As illustratively shown in FIGS. 12(A), 12(B), 12(C), the six pairs of feeding projections 232 (232A to 232F) of the transverse bar 230 are disengaged from the six pallets 112 (112A to 112F) each time the pallets 112 are fed in one feeding cycle, and are returned upstream by a distance corresponding to the one feeding cycle. Subsequently, the six pairs of projections 232 are engaged altogether with upstream six pallets 112 (112B to 112G) which does not any longer include the most downstream pallet 112A and includes a new pallet 112G (not shown) upstream of the second most upstream pallet 112F. Then, the six pallets 112 (112B to 112G) are fed intermittently by the transverse bar 230.

Thus, the repetitive advancing and returning of the transverse bar 230 results in feeding each pallet 112 from the waiting position to the PCB unloading position while each pallet 112 continues to support the same PCB 110. After the pallet 112 has been fed to the PCB unloading position, the PCB 110 is unloaded from the pallet 112 and the pallet 112 is transferred onto the pallet returning device 14. Subsequently, the pallet 112 is returned to the returned-pallet position by the returning device 14. Then, the pallet 112 is transferred onto the fixed and movable guides 180, 182, and a new PCB 110 is loaded on the pallet 112. In this situation, the reference marks fixed to the PCB 110 are picked up. After the picking up of the reference marks, respective positioning errors, $\delta X_P$, $\delta Y_P$, of the PCB 110 relative to the pallet 112 are determined based on the picked up images of the reference marks, and are modified to provide correction data indicative of correction values to correct each of all the predetermined EC mounting positions by negating or zeroing the positioning errors $\delta X_P$, $\delta Y_P$. The EC-mounting-position correction data are stored in the master memory WM of the RAM 336.

The changeable distance (i.e., "guide width") of the fixed and movable guides 180, 182 is pre-adjusted to be suitable for the width (i.e., Y-direction dimension) of the pallets 112 used. In the case where the distance between the pallet returning device 14 and the movable guide 182, or the distance between the fixed and movable guides 180, 182 is great, a support table (not shown) may be provided therebetween to guide the transferring of each pallet 112.

There will be described in detail the operation of the present EC mounting system.

After each pallet 112 has been returned to the returned-pallet position by the pallet returning device 14, that pallet 112 is transferred onto the fixed and movable guides 180, 182, when a space between the PCB feed-in conveyer 250 and the most upstream one of the six pallets 112 being fed by the pallet feeding device 12 becomes large enough to receive one pallet 112. This space is detected by a pallet feed-in sensor 344. A position where the feed-in sensor 344 is provided is adjustable depending upon the size of the pallets 112 used.

When the space detected by the feed-in sensor 344 becomes large enough, the pallet 112 is transferred into the space. When the pallet 112 is transferred, the elevator guide 210 is moved down to the lowermost position thereof, thereby permitting the transferring of the pallet 112. The pallet 112 is moved till the pallet 112 contacts the fixed guide 180. After the transferring, the elevator guide 210 is moved up to be able to guide the pallet 112, and the positioning pins 218 are moved to the operative positions thereof where the pins 218 are fit in the notches 115 and thereby position the pallet 112. The positioning of the pallet 112 in the Y direction is done by the fixed and movable guides 180, 182 and the positioning of the same 112 in the X direction is done by the engagement of the pins 218 with the notches 115.

When the elevator guide 210 is moved up and the positioning pins 218 position the pallet 112, a PCB 110 simultaneously is loaded onto the pallet 112 from the PCB feed-in conveyer 250. To this end, the elevator plate 130 of the pallet 112 is moved down as a result of rotation of the lever 162 due to the operation of one of the air cylinders 168, and the PCB 110 is permitted to be moved into the engagement grooves 118. The PCB 110 is fed into the grooves 118 till a downstream end of the PCB 110 as seen in the pallet feeding direction reaches a PCB feeding-in position corresponding to the downstream ends of the PCB guides 116 of the pallet 112. This PCB feeding-in position is defined by a stopper (not shown).

After the feeding-in of the PCB 110, the lever 162 is rotated in the opposite direction by the air cylinder 168, so that the elevator plate 130 is moved up. Thus, the PCB 110 is supported on the underside thereof by the support members 136 and the back-up pins 140, and is held down by the PCB holding-down members 122. Thus, the PCB 110 is sandwiched by the support members 136 and back-up pins 140 and the hold-down members 122, and is positioned relative to the pallet 110 in the X, Y, and Z directions with high reliability.

A position where the air cylinder 168 is provided is adjustable depending upon the size of the pallets 112 used, such that when each pallet 112 is transferred from the pallet returning device 14 onto the fixed and movable guides 180, 182, the air cylinder 168 is just opposed to an operative end portion of the lever 162.

After the PCB 110 has been loaded on the pallet 112 and the positioning of the pallet 112 by the pins 218 has been completed, the reference marks fixed to the PCB 110 is picked up by the reference-mark pick-up device 270, and the positioning errors $\delta X_P$, $\delta Y_P$ of each of the two reference marks of the PCB 110 relative to the pallet 112 in a horizontal plane are calculated based on the picked-up images. Correction values to correct the predetermined EC mounting positions are determined by, e.g., linear interpolation based on the detected positioning errors of the two reference marks relative to predetermined positions of the reference marks. Thus, the positioning errors of the PCB 110 relative to the pallet 110 are zeroed.

After the picking-up of the reference marks, the pallet 112 is moved to the waiting position by the pallet pushing device 258, and waits for being fed by the pallet feeding device 12. If, at this point of time, an upstream end of the most upstream one of the six pallets 112 being fed by the feeding device 12 is located upstream of the waiting position, the pallet 112 in question is stopped in contact with the most upstream pallet 12, and subsequently is moved to the waiting position while following the most upstream pallet 112.

When each pallet 112 is moved to the waiting position, the pallet 112 is guided by the fixed and movable guides 180, 182. Each time the pallet 112 is moved by one feeding pitch P, the positioning pins 218 are fit in the notches 115 to position the pallet 112 in the X direction. Each pallet 112 is positioned at the waiting position by a stopper (not shown). When the pallet 112 is moved to the EC mounting areas $A_1$ to $A_{16}$, the stopper is retracted to a position thereof where the stopper permits the movement of the pallet 112.

When the most downstream one of the six pallets 112 being fed by the pallet feeding device 12 reaches the PCB unloading position, the pallet 112 in question has been moved to the waiting position. When the transverse bar 230 is returned by the distance corresponding to one feeding cycle, the most upstream pair of feeding projections 230 of the bar 230 are engaged with the pallet 112 in question positioned at the waiting position.

Figure 13:
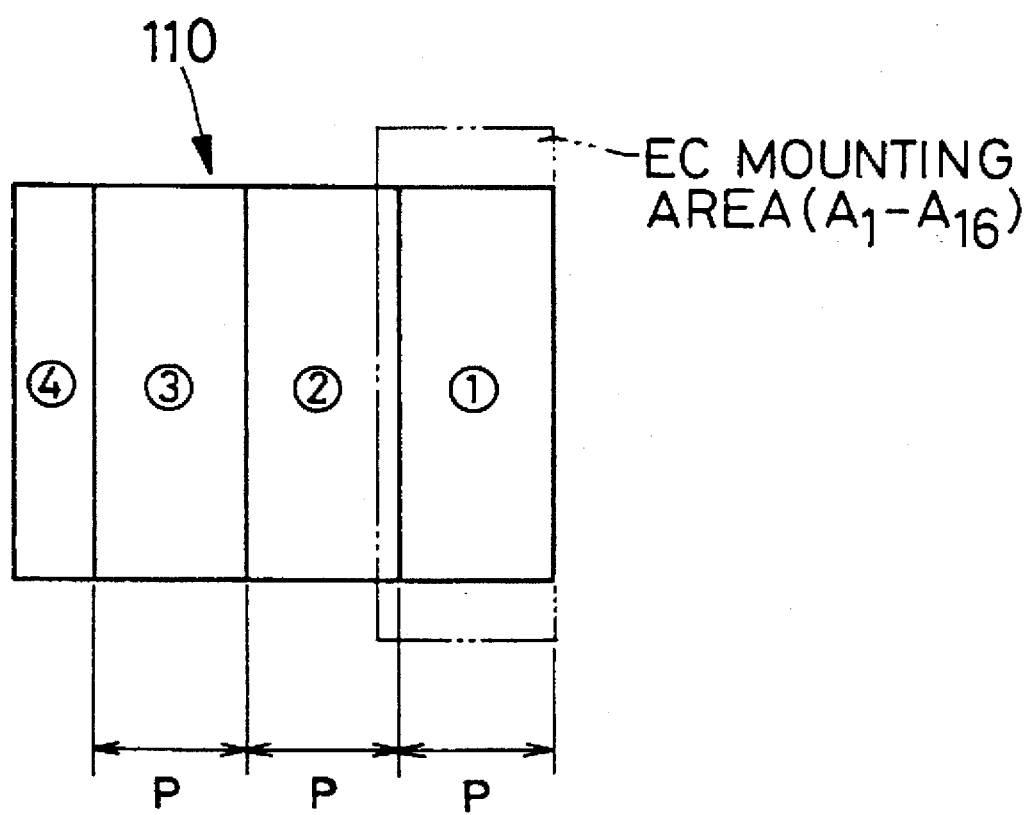
FIG. 13 is a view of EC mounting sections of a printed circuit board (PCB) where ECs are mounted on the PCB by the system of FIG. 1.

After the engagement, the pallet 112 is intermittently fed at the feeding pitch P while ECs are mounted on the PCB 110 supported by the pallet 112. Each PCB 110 has a length corresponding to four feeding pitches 4P, i.e., four EC mounting units 30, and a downstream end of the PCB 110 is aligned with a downstream end of the pallet 112. Therefore, the downstream end of the PCB 110 positioned at the waiting position is remote from each of the sixteen EC mounting areas $A_1$ to $A_{16}$ by just a distance equal to a product of the feeding pitch P and an integral number. Accordingly, when the pallet 112 is fed at the feeding pitch P, the downstream end of the PCB 110 is aligned with the downstream end of one of the EC mounting areas $A_1$ to $A_{16}$. As viewed from each of the EC mounting areas $A_1$ to $A_{16}$, four sections, numbered "1", "2", "3", and "4", of the PCB 110 which are obtained by cutting with the feeding pitch P are sequentially moved to each EC mounting area $A_1$ to $A_{16}$, as shown in FIG. 13.

Thus, each of the sixteen EC mounting units 30 has four control programs corresponding to the four sections "1" to "4" of each PCB 110, respectively. Each of the four programs is used to control each mounting unit 30 to mount ECs at respective EC mounting positions predetermined with respect to the downstream end of a corresponding EC mounting area $A_1$ to $A_{16}$. An appropriate one of the four programs is selected depending upon which section has been moved to each mounting area $A_1$ to $A_{16}$, and ECs are mounted on the section in question according to the selected program. The mounting of ECs on each PCB 110 are designed such that four EC mounting units 30 concurrently operates for mounting the ECs on the PCB 110 and all the ECs are mounted on the PCB 110 in the shortest possible time. To this end, four control programs are prepared for each of the EC mounting units 30.

For mounting ECs on each PCB 110, first, each EC mounting unit 30 is moved to take an EC from the EC supplying device 20. As shown in FIG. 11, each of the EC mounting areas $A_1$ to $A_{16}$ overlaps the adjacent area or areas. In addition, EC taking areas, $B_1$ to $B_{16}$, where the EC mounting units 30 take ECs from the EC supplying device 20 overlap one another in the X direction. The present EC mounting system is designed such that in order to prevent the interference between the respective EC suction devices 82 of adjacent EC mounting units 30, a first group of alternate mounting units 30 take by air suction ECs from the supplying device 20 when a second group of alternate mounting units 30 mount ECs on PCBs 110, and the first group of alternate mounting units 30 mounts the ECs on the PCBs 110 when the second group of alternate mounting units 30 take the ECs from the supplying device 20. When the respective suction devices 82 of the first group of eight mounting units 30 and those of the second group of eight mounting units 30 pass each other in the Y direction, the respective rotary arms 54 of all the mounting units 30 take the posture of orienting in the Y direction, thereby preventing the interferences therebetween. After each EC suction device 82 has held an EC by vacuum suction, the suction device 82 is moved over a corresponding held-EC-posture pick-up device 320 in order that an image of the EC held by the suction device 82 is picked up by the pick-up device 320. To this end, it is naturally needed to control each rotary arm 54 to take the posture of orienting in the Y direction. Thus, orienting the rotary arm 54 in the Y direction is not an additional operation.

After each EC suction device 82 has passed one or two adjacent EC suction device or devices 82, each suction device 82 can be moved in the X direction as a result of rotation of a corresponding rotary arm 54, to take an EC from one of corresponding EC supplying cartridges 290. Subsequently, the posture of the EC suction device 82 is re-oriented in the Y direction. Then, the posture of the EC held by the suction device 82 is picked up by the EC-posture pick-up device 320. Based on the picked-up image of the EC posture, positional errors, $\delta X_E$, $\delta Y_E$, of the EC held by the EC suction device 82 in a horizontal plane and an angular error, $\delta\theta$, of the EC with respect to an axis line of the suction device 82 are calculated. The angular error $\delta\theta$ is corrected by rotating the EC suction device 82, before the EC suction device 82 has been moved to a corresponding EC mounting position on the PCB 110. However, small deviations $\delta x$, $\delta y$ as measured in the X and Y directions are produced as a result of the correction of the angular error $\delta\theta$. If it can be said that the positional errors of the EC mounting positions calculated based on the picked-up images of the reference marks are "primary" errors, then it can be said that the holding errors $\delta X_E$, $\delta Y_E$ and the correction-related deviations $\delta x$, $\delta y$ are "secondary" errors of the EC mounting positions. The primary and secondary errors are corrected by changing respective amounts of movement of the EC suction device 82 in the X and Y directions.

Each of the first to sixteenth mounting-unit-associated correction data memories $M_1$ to $M_{16}$ stores correction data indicative of correction values to correct the predetermined EC mounting positions and thereby compensate for the positioning errors ($\delta X_{P1}$, $\delta Y_{P1}$), ($\delta X_{P2}$, $\delta Y_{P2}$) of the two reference marks of each PCB 110 relative to a pallet 112, when the PCB 110 enters a corresponding EC mounting area $A_1$ to $A_{16}$ of a corresponding EC mounting unit 30. More specifically described, when each PCB 110 reaches the EC mounting area $A_1$ to $A_{16}$ of each EC mounting unit 30, the correction data stored in a corresponding correction data memory $M_1$–$M_{15}$ for each EC mounting unit 30 are copied and stored in another correction data memory $M_2$–$M_{16}$ for the following or downstream-direction adjacent EC mounting unit 30. Each of the mounting-unit-associated correction data memories $M_1$ to $M_{16}$ stores the correction data for all the EC mounting positions predetermined on each PCB 110 where ECs are to be mounted. Once each memory $M_1$ to $M_{16}$ stores the correction data for a PCB 110, that memory does not store new correction data before another PCB 110 enters a corresponding EC mounting area $A_1$ to $A_{16}$, i.e, before the PCB 110 in question is intermittently fed four times, each by the feeding pitch P. The most upstream mounting-unit-associated memory $M_1$ receives and stores correction data from the master memory WM.

When each of the sixteen EC mounting units 30 mounts ECs on a PCB 110, the control device 330 reads correction data from a corresponding memory $M_1$ to $M_{16}$, corrects the EC mounting positions predetermined according to the EC mounting programs based on the first correction data read from the memory $M_1$ to $M_{16}$ and second correction data indicative of correction values to correct the secondary errors, i.e, EC-holding errors $\delta X_E$, $\delta Y_E$ and correction-related deviations $\delta x$, $\delta y$, and controls each mounting unit 30 to mount ECs at the corrected EC mounting positions on the PCB 110, respectively.

Each PCB 110 is continuously supported by the same pallet 112 while the PCB 110 is fed from the most upstream EC mounting unit 30 to the most downstream unit 30. Each time the PCB 110 is fed by the feeding pitch P, some of the positioning pins 200 are fit in the notches 115 of the pallet 112 to position the pallet 112 in the X direction. Thus, when ECs are mounted on the PCB 110 supported by the pallet 112, the PCB 110 is accurately positioned in the X and Y directions by the positioning pins 200, notches 115, and fixed and movable guides 180, 182. Therefore, ECs are accurately mounted on the PCB 110, at the EC mounting positions corrected based on the primary errors which are obtained based on the positioning errors of the PCB 110 relative to the pallet 112 in the waiting area.

After ECs have been mounted on a PCB 110 supported on a pallet 112 and the pallet 112 has been fed to the PCB unloading position, the elevator plate 130 of the pallet 112 is moved down by the other of the air cylinders 168 which is provided at the PCB unloading position. Thus, the PCB 110 is made free from the supporting of the pallet 112. Subsequently, the PCB 110 is unloaded onto the PCB feed-out conveyer 252 by the PCB unloading device 256, and then the pallet 112 is transferred onto the pallet returning device 14. To this end, the elevator guide 212 is moved down to permit the transferring of the pallet 112. When the pallet feed-out sensor 346 identifies that the transferring of the pallet 112 onto the pallet returning device 14 has been finished, the elevator guide 212 is moved up to be able to guide another pallet 112.

Whichever size a pallet 112 may have, the pallet 112 is fed to, and stopped at, the PCB unloading position where the pallet 112 is transferred onto the pallet returning device 14. Accordingly, at the PCB unloading position, the air cylinder 168 is provided as a fixed element so as to be able to engage the lever 162 of the pallet 112 fed to the unloading position and rotate the lever 162.

In the present EC mounting system, the X-direction movement ranges or areas of the EC suction devices 82 of the sixteen EC mounting units 30 overlap one another. Therefore, there is no range or area in the X direction where the mounting of ECs on PCBs 110 cannot be carried out by the EC suction devices 82. Stated differently, the mounting of ECs on PCBs 110 is effected at any position between the most upstream and most downstream EC mounting areas $A_1$–$A_{16}$. Thus, ECs are mounted on PCBs 110 with high efficiency.

In addition, there is no range or area in the X direction where the EC suction devices 82 cannot take ECs from the EC supplying device 20. Therefore, the EC supplying cartridges 290 can be used without having to provide any clearances therebetween. Thus, the overall length of the EC supplying device 20 as measured in the X direction can be reduced, and the overall length of the present EC mounting system in the X direction can be reduced. The present system can be used in a reduced space.

Since the present EC mounting system enjoys a reduced X-direction length, the system also enjoys reduced manufacturing errors and/or reduced thermal expanses due to increased temperatures. Thus, the present system can be manufactured with high accuracy, and the accuracy of mounting of ECs on PCBs 110 is improved.

Moreover, in the present EC mounting system, each pallet 112 is returned by the pallet returning device 14 after the mounting of ECs on the PCB 110 supported by the pallet 112 has been completed. Since a plurality of pallets 112 are circularly used, the number of the pallets 112 used can be reduced.

In addition, eight EC supplying cartridges 290 are mounted as a unit on each cart 294, and four carts 294 are employed. Thus, each group of cartridges 290 can be replaced by another group, or otherwise each cart 294 as a whole can be replaced by another cart 294. This replacement can be done in a shorter time than that needed to replace each cartridge 290 with another. Since rest times needed for the replacements of EC supplying cartridges 290 are shortened, the efficiency of mounting of ECs on PCBs 110 is improved.

As is apparent from the foregoing description, in the present embodiment, the EC suction device 82 provides an EC mounting device; the Y-direction slide member 38 provides a movable member; the ball screw 36, the Y-direction servo motor 40, and others cooperate with one another to provide a movable-member drive device; the reduction gear unit 56, the timing pulleys 60, 61, the timing belt 62, the arm-rotating servo motor 64, and others cooperate with one another to provide a rotary-arm drive device; the Z-direction slide member 68 and the Z-direction servo motor 72 cooperate with each other to provide a Z-direction drive device; the movable member, the movable- member drive device, the rotary-arm drive device, and the Z-direction drive device cooperate with the rotary arm 54 to provide a EC-mounting-device moving device.

Moreover, in the present embodiment, the PCBs 110 provide objects on which ECs are mounted; the pallets 112 provide supporting devices for supporting the objects; the fixed and movable guide members 180, 182, the positioning pins 200, the transverse bar 230, the feeding projections 232, the pallet-feeding servo motor 240, and others cooperate with one another to provide the pallet feeding device 12 as a supporting-device feeding device; the PCB loading device 254 provides an object loading device; and the PCB unloading device 256 provides an object unloading device.

Furthermore, the reference-mark pick-up device 270 and a portion of the control device 330 which determines the positioning errors of each PCB 110 relative to a pallet 112 based on image data representative of the picked-up images of the reference marks fixed to the PCB 110, cooperate with each other to provide a positioning-error detecting device; and the control device 330 provides an EC-mounting control device.

Figure 14:
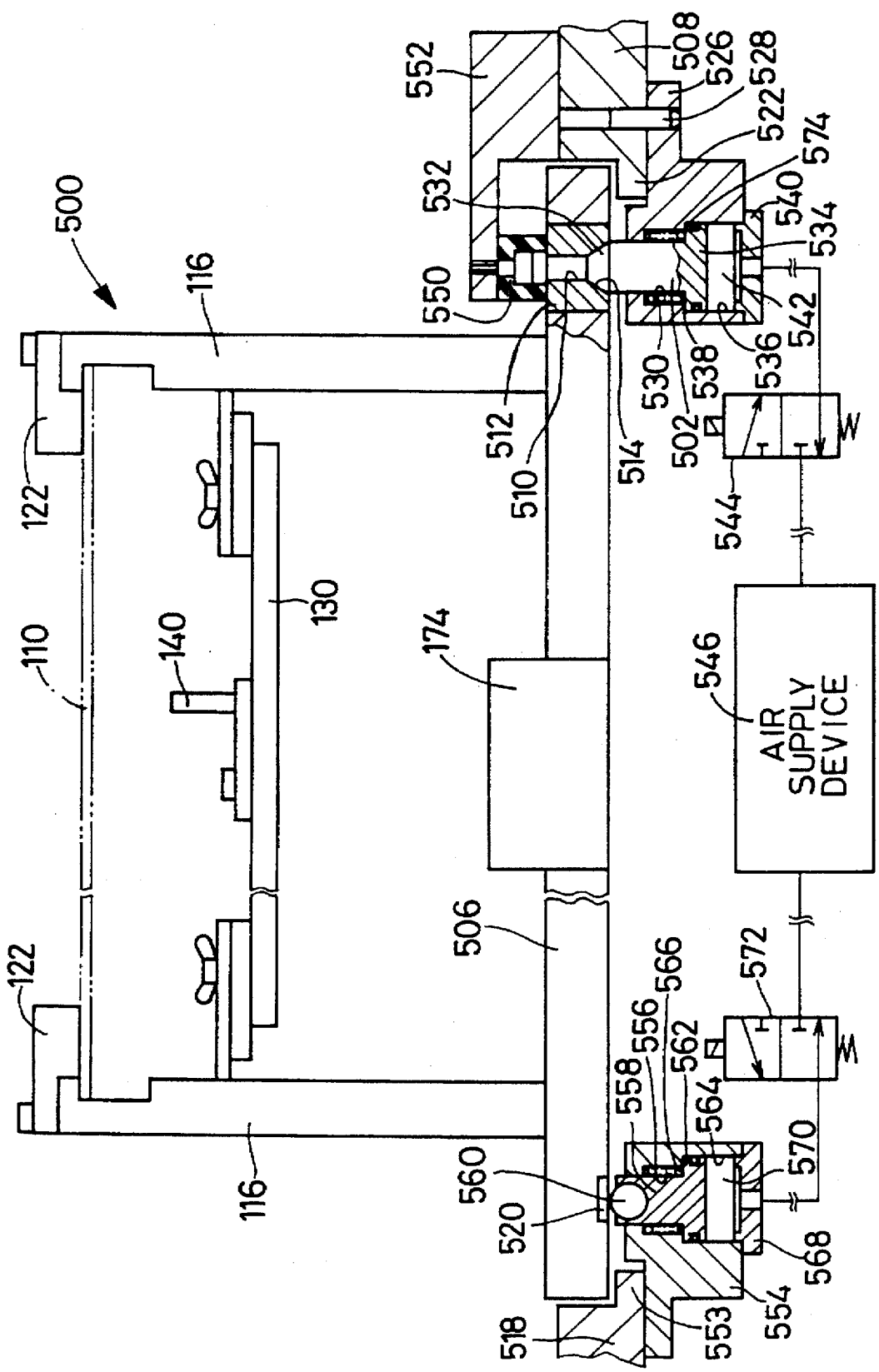
FIG. 14 is a partly cross-sectional, elevation view of a pallet and a pallet feeding device of another EC mounting system as a second embodiment of the invention.

Although, in the above-described first embodiment, each pallet 112 is positioned by the positioning pins 200 which are movable in a horizontal direction, it is possible to employ positioning pins 502 (only one 502 is shown) which are movable in a vertical direction as shown in FIG. 14.

Figure 15:
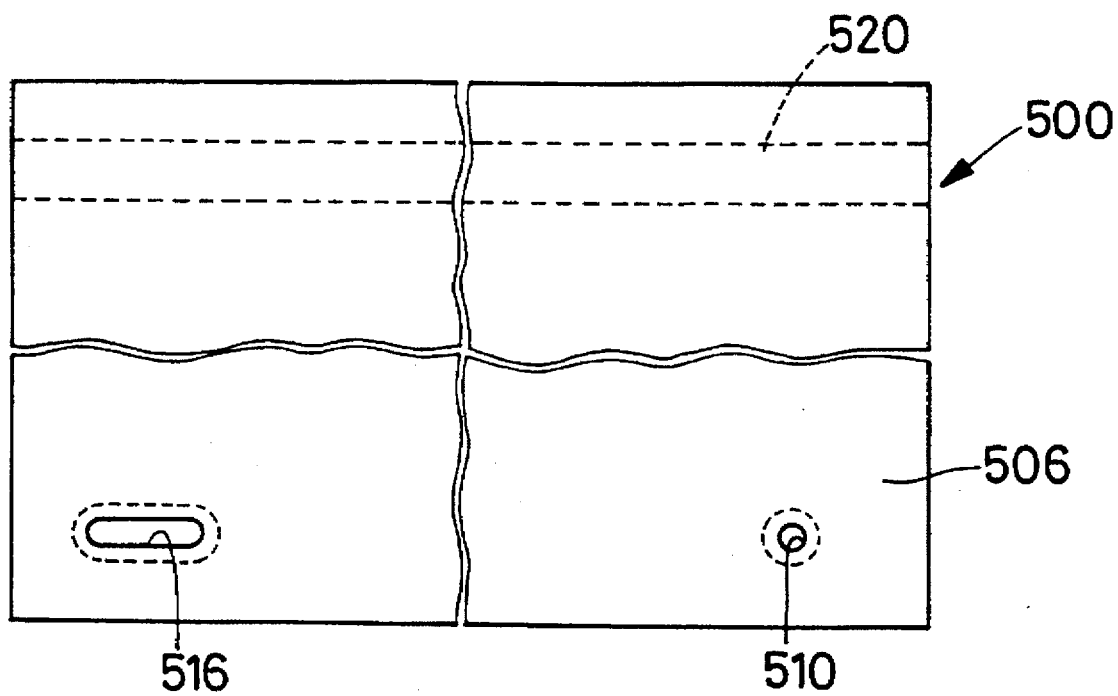
FIG. 15 is a plan view of the pallet of FIG. 14.

Pallets 500 (only one 500 is shown) have a construction similar to that of the pallets 112 employed in the first embodiment. Each pallet 500 includes a base table 506 which has a positioning hole 510 near one of opposite edge lines thereof on the side of a fixed guide member 508 as shown in FIGS. 14 and 15. The positioning hole 510 is formed through a block member 512 which is made of a wear-resistant material and is fixed to the pallet 500, and includes a conical portion 514 which opens downward in a lower surface of the base table 506. The block member 512 is quenched, and the conical portion 514 is finished with accuracy by grinding.

At a position spaced from the positioning hole 510 by a distance equal to a product of the feeding pitch P and an integral number in the pallet feeding direction, there is provided an elongate hole 516 as shown in FIG. 15. The area of opening of the elongate hole 516 in the lower surface of the base table 506 is larger than that of the same 516 in an upper surface of the same 506. The elongate hole 516 has an inner surface which is inclined by the same angle as the angle of inclination of the conical portion 514. A plate member 520 made of a wear-resistant material is fixed to a lower surface of an end portion of the base table 506 on the side of a movable guide member 518, such that the plate member 520 extends in the pallet feeding direction. The plate member 520 is quenched, and is finished with accuracy by grinding.

The fixed guide 508 includes a horizontal support portion 522 which supports the base table 506 of the pallet 500 on the underside thereof. A block member 526 which extends from an upstream end of the waiting area to the PCB unloading position, is positioned relative, and fixed, to the fixed guide 508 by a pin 528. A plurality of vertical stepped holes 530 are formed through the block member 526 at a pitch equal to the feeding pitch P. One positioning pin 502 is fit in each stepped hole 530 such that the positioning pin 502 is movable up and down. Each positioning pin 502 has a tapered top portion 532 which is inclined by an angle corresponding to the inclination angle of the conical portion 514. Each pin 502 has a bottom portion in the form of a piston 534 which is airtightly and slideably fit in a cylindrical bore 536 as a large-diameter portion of the stepped hole 530 and is biased downward by a biasing spring 538.

The stepped holes 530 are formed in the block member 526, such that the holes 530 are spaced at a highly accurate pitch and have a highly accurate diameter. The positioning pins 502 are made of a wear-resistant material, quenched, and subsequently finished by grinding with high accuracy. Thus, the pins 502 are provided on the fixed guide 508 with accuracy.

An opening of the cylindrical bore 536 is closed by a cap member 540 so as to define a fluid-tight air chamber 542 which is selectively communicated with an air supply device 546 and ambient atmosphere.

A pallet hold-down member 550 is fixed to the fixed guide 508 at a position corresponding to the position of provision of each positioning pin 502 in the pallet feeding direction. The hold-down member 550 is made of rubber, and is fixed to a lower surface of an attachment member 552 which is fixed to an upper surface of the fixed guide 508 so as to extend toward the pallets 500.

The movable guide 518 includes a support portion 553 which supports the pallets 500 on the underside thereof. A plurality of block members 554 are fixed to the movable guide 518, and a vertical stepped hole 556 is formed through each of the block members 554. A pallet support member 558 is fit in each stepped hole 556 so as to be movable up and down. The pallet support members 558 are provided at such a regular interval which ensures that the support members 558 can support even the smallest pallets 500 even when those pallets 500 are fed at any feeding pitch. Each support member 558 holds, in a top portion thereof, a ball 560 such that the ball 560 is rotatable and a top portion of the ball 560 slightly projects from a top end of the support member 558. The support member 558 has a lower portion in the form of a piston 562 which is airtightly and slideably fit in a cylindrical bore 564 as a large-diameter portion of the stepped hole 556 and is biased downward by a biasing spring 566.

An opening of the cylindrical bore 556 is closed by a cap member 568 so as to define a fluid-tight air chamber 570 which is selectively communicated with the air supply device 546 and the ambient atmosphere. Like in the first embodiment, the movable guide 518 includes respective portions extending upstream and downstream from the range of the EC mounting machine 16, and includes respective elevator guide members (not shown) as the upstream and downstream extended portions thereof. Each elevator guide member is movable up and down, and one or more support members 558 are provided in each elevator guide so as to be movable up and down with the elevator guide.

Like the pallets 112 employed in the first embodiment, the pallets 500 are intermittently fed by a transverse bar to which feeding projections are fixed (not shown). When the pallets 500 are fed, the positioning pins 502 and the support members 558 are held at lowermost positions thereof where the elements 502, 558 are disengaged from the positioning and elongate holes 510, 516 and the plate member 520, respectively, thereby permitting the feeding of the pallets 500. Thus, the pallets 500 are fed while being supported from the underside thereof by the respective support portions 522, 553 of the fixed and movable guides 508, 518.

After the pallets 500 are fed by one feeding pitch P, two of the positioning pins 502 which correspond to the positioning and elongate holes 510, 516 of each pallet 500 are moved up to position the pallet 500, and one of the pallet supports 558 is selected and moved up to support the pallet 500.

First, the selected support member 558 is moved up so that the ball 560 is brought into contact with the plate member 520. Following the commencement of moving up of the support member 558, the positioning pin 502 corresponding to the positioning hole 510 is moved up so that the tapered portion 532 fits into the conical portion 514. Following the commencement of moving up of the positioning pin 502, the positioning pin 502 corresponding to the elongate hole 516 is moved up to fit into the hole 516.

Possible positional errors of each pallet 500 in the X and Y directions are corrected by the fitting of one positioning pin 502 in the positioning hole 510, and a possible angular error of the pallet 500 about the Z direction is corrected by the delayed fitting of the other positioning pin 502 in the elongate hole 516. After the positioning pins 502 have been fit in the positioning and elongate holes 510, 516, respectively, the pins 502 are further moved up till the respective pistons 534 of the pins 502 are brought into contact with respective shoulders 574 of the stepped holes 530. Thus, the base table 506 of each pallet 500 is pressed against the hold-down member 550, and the positioning pins 502 and the positioning and elongate holes 510, 516 are positively pressed against each other because of the elastic force of the hold-down member 550. Additionally, the base table 506 is held in close contact with the ball 560. Thus, each pallet 500 is supported at three points by the two pins 502 and the support member 558.

As described above, the positioning pins 502 are provided with high accuracy on the fixed guide 508, so that the tapered portions 532 of the pins 502 can correct possible positional and angular errors of the pallets 500 and position the same 500 with high accuracy. Consequently the present EC mounting system can mount ECs on PCBs with high accuracy.

The hold-down members 550 may be omitted particularly in the where the pallets 500 are very heavy and the positioning pins 502 and the positioning and elongate holes 510, 512 are pressed against each other with sufficiently great forces.

Figure 16:
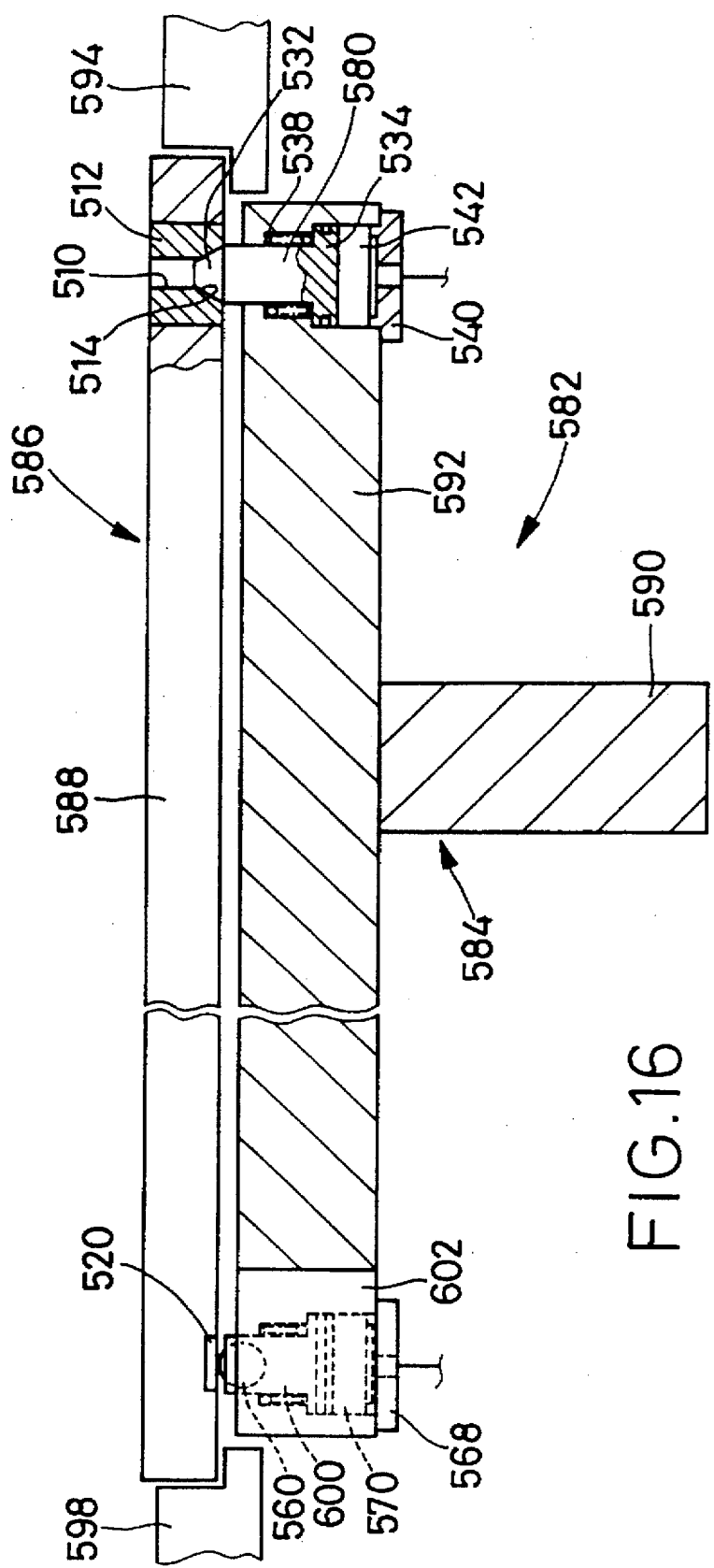
FIG. 16 is a partly cross-sectional, elevation view of a pallet and a pallet feeding device of yet another EC mounting system as a third embodiment of the invention.

Although in the first embodiment the positioning pins 200 are provided on the movable guide 180 and in the second embodiment the positioning pins 502 are provided on the fixed guide 508, it is possible that, as shown in FIG. 16, positioning pins 580 (only one 580 is shown) be provided on a feeding member 584 of a pallet feeding device 582. Pallets 586 have a construction similar to that of the pallets 500. The same reference numerals as used in FIGS. 14 and 15 are used to designate the corresponding elements or parts of the pallets 586, and the description of those elements or parts is omitted. FIG. 16 shows only a base table 588 of one pallet 586.

The feeding member 584 includes a driven plate 590 having a length from the most upstream end of the EC mounting machine 16 to the PCB unloading position, and also includes a support plate 592 which is fixed to the driven plate 590 so as to extend horizontally and has the same length as that of the driven plate 590. The driven plate 590 is intermittently fed by a servo motor (not shown), at a feeding pitch equal to a pitch at which the EC mounting units 30 are arranged. The support plate 592 has a pair of opposite end portions which extend parallel to the pallet feeding direction, and a number of positioning pins 580 are provided in one of those end portions of the support plate 592 which one end portion is nearer to a fixed guide member 594. More specifically, the positioning pins 580 are provided at respective locations which are equidistant from one another at a regular interval of distance equal to the pallet feeding pitch. The pins 580 have the same construction as that of the positioning pins 502 shown in FIG. 14, and are moved up and down in the same manner so that the pins 580 are engaged with, and disengaged from, a positioning hole 510 and an elongate hole 516 of each pallet 586.

Support members 600 (only one 600 is shown) are provided in the other end portion of the support plate 592 nearer to a movable guide member 598, such that each support member 600 is movable up and down. Accommodating members 602 are equidistantly provided on an end surface of the support plate 592 on the side of the movable guide 598, and the support members 600 are accommodated in the accommodating members 602, respectively. The support members 600 are moved up and down in the same manner as that in which the support members 558 shown in FIG. 14 are moved up and down.

Like the positioning pins 502, one pair of positioning pins 580 are fit in the positioning hole 510 and elongate hole 516 of each pallet 586, so as to position and support that pallet 586, while one support member 600 supports the same pallet 586. Thus, each pallet 586 is intermittently fed when the feeding member 584 is intermittently moved with that pallet 586 being positioned and supported by two positioning pins 580 and one support member 600. After the pallets 586 are fed by a distance equal to the pitch of arrangement of the pallets 586, the positioning pins 580 are disengaged from the positioning holes 510 and elongate holes 516 of the pallets 586, and the support members 600 are disengaged from the pallets 586 so as not to any longer support the same 586. Thus, the pallets 586 are brought into a state in which the pallets 586 are supported by the fixed and movable guides 594, 598. From this state, the feeding member 584 is returned and each pair of positioning pins 580 and each support member 600 are newly engaged with a pallet 586 upstream adjacent to the pallet 586 from which that pair of pins 580 and that support member 600 have just been disengaged. Thus, the pallets 586 are again positioned and supported by the positioning pins 580 and the support members 600, and are again fed by the servo motor (not shown).

In the present, third embodiment, both the positioning of the pallets 586 and the positioning of the feeding member 584 of the pallet feeding device 582 are carried out by the positioning pins 580. Thus, the construction of the present EC mounting system is simplified. In the case where the positioning pins 580 and the support members 600 are provided at small pitches, the single sort of feeding member 584 can be used to feed each of different sorts of pallets 586 having different sizes, by selectively operating appropriate ones of the pins and supports 580, 600.

In each of the first to third embodiments, the pallets 112, 500, 586 are fed such that the downstream end of each pallet 112, 500, 586 and the downstream end of a PCB 110 supported thereon are aligned with the downstream end of each of the EC mounting areas $A_1$ to $A_{16}$. However, this is not essentially required. It is possible to mount ECs on a PCB 110 without any problems by intermittently feeding pallets such that the downstream end of each pallet is stopped at respective positions not aligned with the downstream ends of the EC mounting areas $A_1$–$A_{16}$ in the pallet feeding direction.

Figure 17:
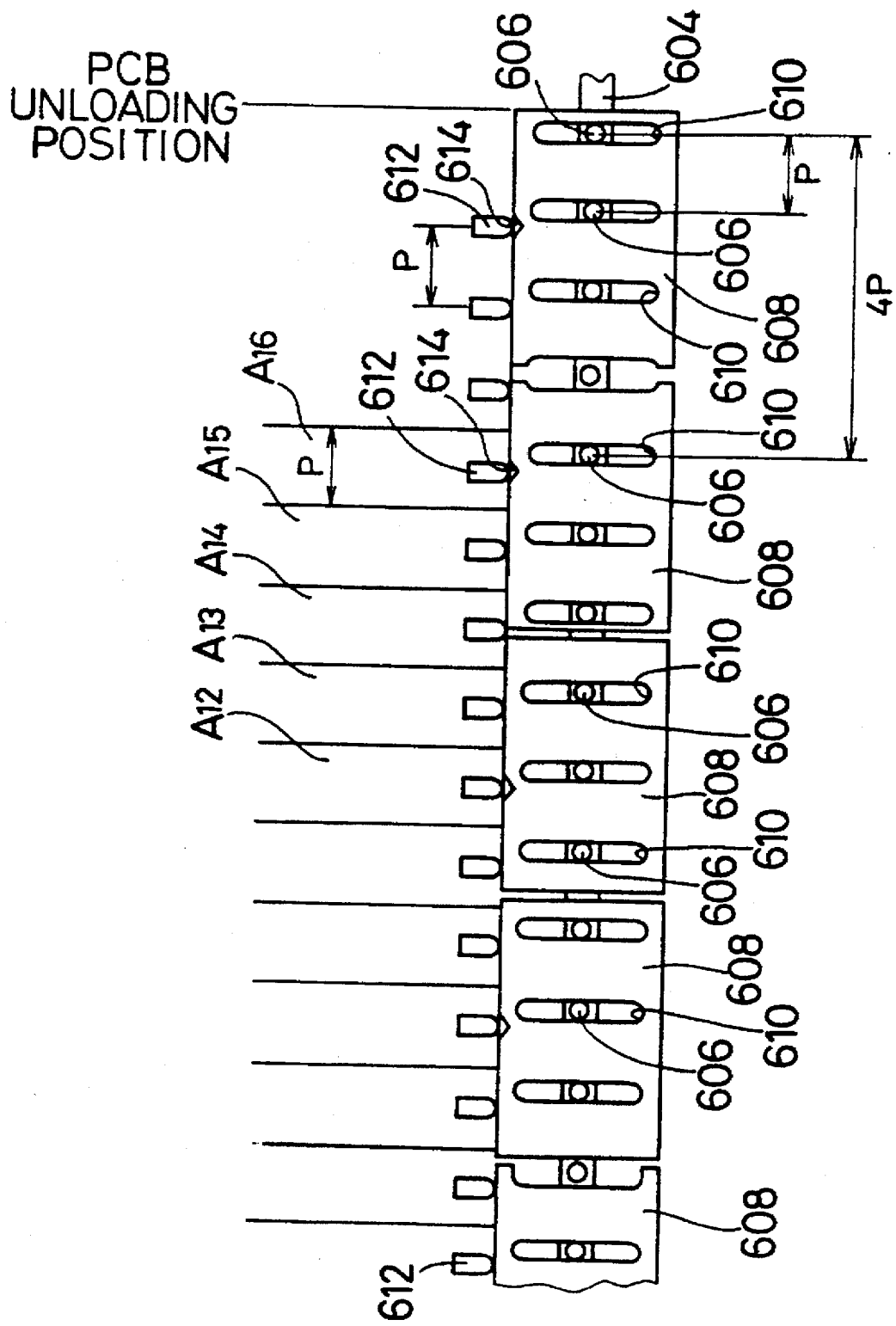
FIG. 17 is a plan view of a pallet and a pallet feeding device of another EC mounting system as a fourth embodiment of the invention.

For example, FIG. 17 shows a transverse bar 604 having feeding pins 606 each of which has a circular cross section and which are provided at a pitch equal to a pallet feeding pitch P. Like the transverse bar 230 shown in FIG. 2, the bar 604 can be rotated by 90 degrees in each of opposite directions so that the pins 606 are engaged with, and disengaged from, elongate holes 610 of pallets 608 (or grooves formed in lower surfaces of the pallets 608). Like the first to third embodiments, the pallet feeding pitch P is equal to the interval of distance at which the EC mounting units 30 are provided. After the transverse bar 604 has been moved intermittently by a plurality of feeding pitches P by a servo motor (not shown), the bar 604 is returned to an initial position thereof. The feeding pins 606 may be provided at a pitch equal to a product of the feeding pitch P and an integral number, or a quotient obtained when the feeding pitch P is divided by an integral number. It is, however, required that the pins 606 be provided at a pitch ensuring that at least one pin 606 engages a pallet having the smallest size.

Each pallet 608 shown in FIG. 17 is 3.2 times as long as the feeding pitch P. Whenever the transverse bar 604 is intermittently moved four times, i.e., four pitches 4P, the bar 604 is returned to the initial position. The elongate holes 610 are formed at locations corresponding to the feeding pins 606 in such a manner that each pair of adjacent pallets 608 are arranged with the least possible spacing being left therebetween. The pallets 608 are arranged at a pitch shorter than four feeding pitches 4P corresponding to one feeding cycle, and respective positions of the elongate holes 610 of each pallet 608 are different from those of the other pallets 608. In this case, therefore, the PCB unloading position slightly changes depending upon the pallets 608 having the different holes 610.

A number of positioning pins 612 are provided on a movable guide member (not shown), at a pitch equal to the feeding pitch P. Each pallet 608 has a conical notch 614 at a location thereof ensuring that when the most downstream pallet 608 is positioned at the PCB unloading position, the notch 614 engages one of the positioning pins 612 which is the nearest to the middle position of each pallet 608 in the pallet feeding direction. Each of the pins 612 is moved by by an air cylinder independently of the other pins 612, so that the above-indicated one pin 612 is engaged with the notch 614 of each pallet 608.

A PCB 110 is put on each pallet 608 such that the downstream end of the PCB 110 is aligned with that of each pallet 608. However, since the pallets 608 are supported on the transverse bar 604 with the small spacings being left therebetween and the pitch of arrangement of the pallets 608 is shorter than a feeding distance (i.e., four feeding pitches 4P) corresponding to one feeding cycle, a length of a downstream end portion of each pallet 608 which portion is aligned with each of the EC mounting areas $A_1$-$A_{16}$ in the feeding direction, changes depending upon the pallets 608 having the different notches 614, as shown in FIG. 17. In FIG. 17, each of the EC mounting areas $A_1$-$A_{16}$ is indicated at a straight line representing the downstream end thereof.

In the first to third embodiments, the sixteen EC mounting units 30 are operated according to the four EC mounting programs corresponding to the four sections of each pallet 112, 500, 586. However, in the present, fourth embodiment, each EC mounting unit 30 is operated according to a control program wherein the downstream end of each pallet 608 is utilized as a reference position. When the PCBs 110 are fed on the different pallets 608, each EC mounting unit 30 modifies data indicative of predetermined EC mounting positions based on which portion of each PCB 110 is aligned with one of the EC mounting areas $A_1$-$A_{16}$ which corresponds to that mounting unit 30, and mounts ECs at the thus modified EC mounting positions on that PCB 110.

Figure 18:
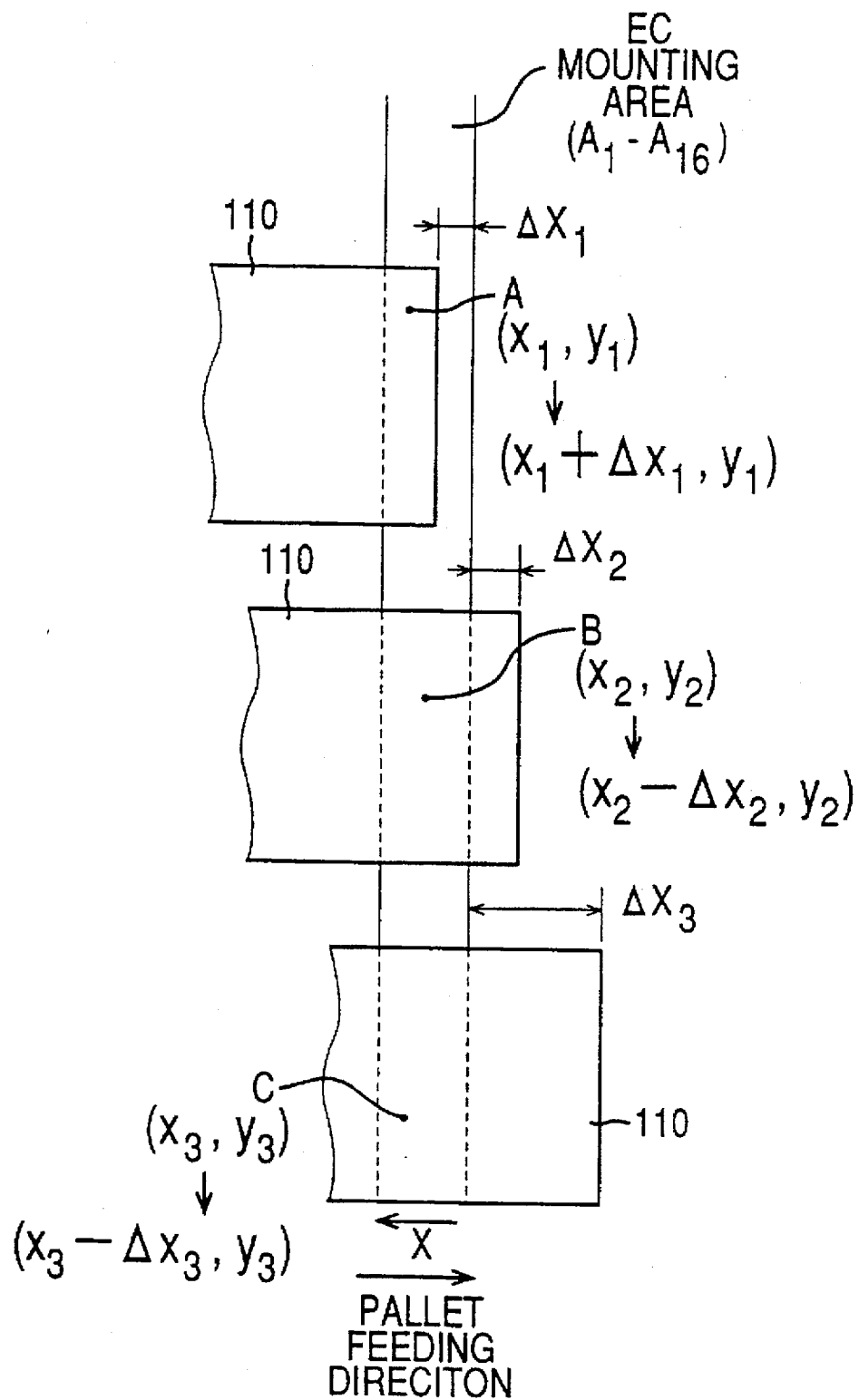
FIG. 18 is a view for illustrating the manner in which EC mounting positions on a PCB are corrected when a pallet supporting the PCB is fed by the pallet feeding device of FIG. 17.

In the case where there is a distance, $\delta x_1$, between the respective downstream ends of one EC mounting area $A_1$-$A_{16}$ and one PCB 110 as shown in FIG. 18, the value $\delta_1$ is added to an x coordinate value of an EC mounting position, A ($x_1$, $y_1$). Thus, the initial EC mounting position data are modified into new data wherein the x coordinate value of the downstream end of each EC mounting area $A_1$-$A_{16}$ is zero ("0"). In this embodiment, x coordinate values increase in a direction opposite to the pallet feeding direction. In the present embodiment, since the downstream end of each PCB 110 is aligned with the downstream end of each pallet 608, the current position of each PCB 110 relative to the EC mounting area of each pallet 608 can be known from the current amount of feeding of each PCB 110 and accordingly the above distance $\delta x_1$ is obtained by calculation. This value $\delta x_1$ is utilized together with the EC-mounting-position correction values, the EC-holding errors, and the errors produced by correcting the angular error θ, when ECs are mounted on the PCB 110.

In the case where the PCB 110 is fed by one feeding pitch P from the above first state and consequently the downstream end of the PCB 110 goes over the downstream end of the EC mounting area by a distance, $\delta x_2$, the value $\delta x_2$ is subtracted from an x coordinate value of an EC mounting position, B ($x_2$, $y_2$), and an EC is mounted at the thus modified position on the PCB 110. In the case where the PCB 110 is additionally fed by one more feeding pitch P from the above second state and the downstream end of the PCB 110 goes over the downstream end of the EC mounting area by a distance, $\delta x_3$, the value $\delta x_3$ is subtracted from an x coordinate value of an EC mounting position, C ($x_3$, $y_3$).

Even in the case where PCBs 110 are supported on the pallets 608 such that the downstream end of each PCB 110 is located at a position upstream of the downstream end of a corresponding pallet 608, the position of the downstream end of the PCB 110 can be known from that of the pallet 608, if a position of the PCB 110 relative to the pallet 608 is known in advance. In this case, too, the distance between the respective downstream ends of the PCB 110 and the pallet 608 can be calculated, and ECs can be mounted at EC mounting positions modified based on the calculated distance.

Even in the case where pallets 608 in a size are changed with pallets 608 in a different size, it is not necessary to change the transverse bar 604 with a different one, if the pallets 608 in each size have elongate holes 610 at locations corresponding to the feeding pins 606 of the single transverse bar 604. In this case, the changing of the pallets 608 from one size to another is easily carried out.

Although in the present, fourth embodiment the EC mounting units 30 are operated according to the EC mounting program wherein the downstream end of each PCB 110 is utilized as a reference position, it is possible to employ an EC mounting program wherein the downstream end of each EC mounting area $A_1$-$A_{16}$ is utilized as a reference position. In the latter case, too, a distance between the respective downstream ends of each PCB 110 and each EC mounting area $A_1$-$A_{16}$ is calculated, and ECs can be mounted at EC mounting positions modified based on the calculated distance.

In each of the first to fourth embodiments, it is possible to modify, by linear transformation, the initial EC mounting position data into new EC mounting position data free from the PCB positioning errors, and store the thus modified EC mounting position data in a memory. A function equation for the linear transformation is obtained based on the respective positioning errors of the two reference marks. In the latter case, each EC mounting unit 30 further modifies the modified EC mounting position data based on the above-mentioned distances $\delta x_1$-$\delta x_3$, the EC-holding errors, and the errors produced by correcting the angular error θ.

In the fourth embodiment shown in FIGS. 17 and 18, each pallet 608 that is fed without aligning the downstream end thereof with that of each EC mounting area $A_1$-$A_{16}$, may be positioned on the underside thereof, by employing the positioning pins 502, 580 employed in the second or third embodiment shown in FIG. 14 or 16. For example, in the case where the positioning pins 580 are provided on the pallet feeding member 592 as shown in FIG. 16, the positioning pins 580 function as both the feeding pins 606 and the positioning pins 612. In the last case, a positioning hole 510 and an elongate hole 516 are formed in each of the pallets 608, at respective locations where the holes 510, 516 are engageable with two of the positioning pins 580, respectively.

In each of the first to fourth embodiments, the pallets 112, 500, 586, 608 are intermittently fed at the feeding pitch P equal to the intervals of distance at which the EC mounting units 30 are provided. The pallet feeding pitch P may not be limited to the value equal to the mounting-unit interval but may be selected at a value smaller or greater than the interval. For example, the feeding pitch P may be equal to a quotient obtained when the mounting-unit interval is divided by an integral number, or a product obtained when the interval is multiplied by an integral number, or otherwise may simply be smaller or greater than the interval without needing any particular relationship between the feeding pitch P and the interval. In each embodiment, the respective movement ranges of each pair of adjacent EC mounting devices 82 partly overlap each other, i.e., each pair of adjacent EC mounting areas $A_1$–$A_{16}$ partly overlap each other, and there is no area to which the EC mounting devices 82 cannot be moved. Therefore, the pallet feeding pitch P can be selected at any desirable value. In the case where the EC feeding pitch P is selected at a value greater than the mounting-unit interval, it is difficult, but possible, to produce EC mounting programs adapted to the great feeding pitch P, wherein each EC mounting unit 30 operates for mounting ECs on a particular portion or portions of each PCB 110.

Figure 19:
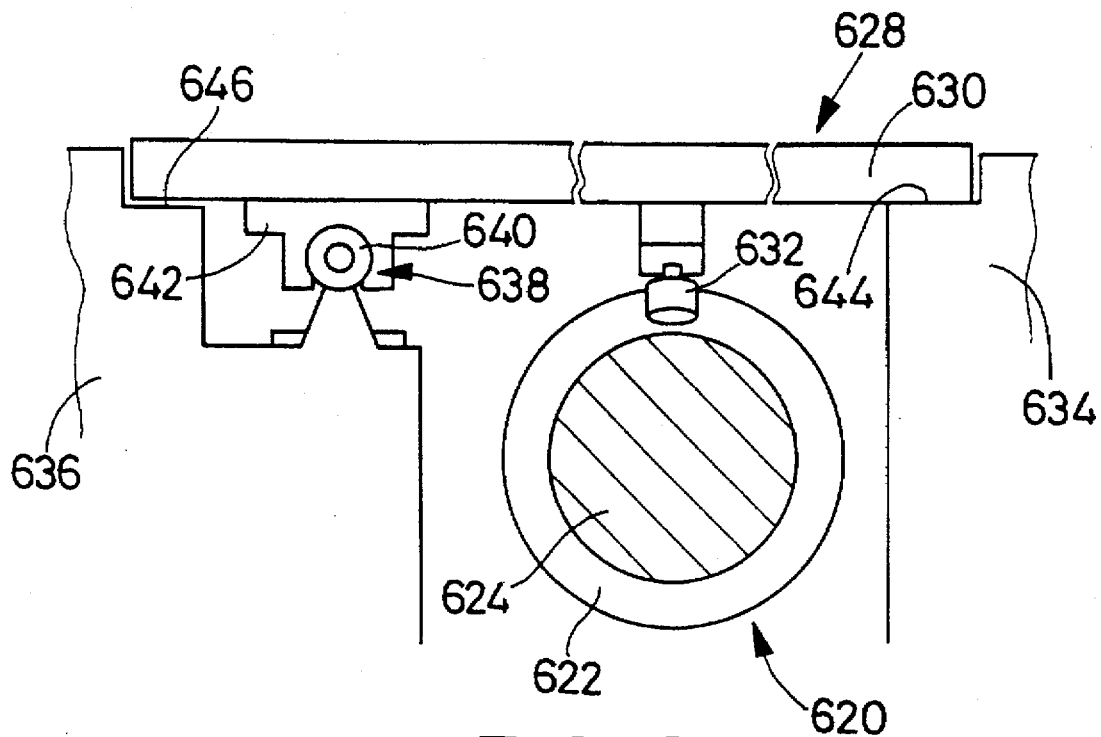
FIG. 19 is a partly cross-sectional, elevation view of a pallet and a pallet feeding device of another EC mounting system as a fifth embodiment of the invention.

In each of the first to fourth embodiments, the pallets 112, 500, 586, 608 are intermittently fed by the reciprocating transverse bar 230, 604 or the reciprocating feeding member 584. However, the pallet feeding device is not limited to one including a reciprocating, pallet feeding member. For example, it is possible to use a pallet feeding device 620, as shown in FIG. 19, which includes (a) a cam member 624 having a spiral ridge 622 in an outer surface thereof and extending from the most upstream end of the EC mounting machine 16 to the PCB unloading position, and (b) a servo motor (not shown) for rotating the cam 624. A pair of engagement rollers 632 (only one 632 is shown in FIG. 19) as a cam follower is provided on a lower surface of each pallet 628 and cooperate with each other to sandwich the spiral ridge 622 of the cam 624. In FIG. 19, the spiral ridge 622 is illustrated without taking a lead angle thereof into consideration.

Figure 20:
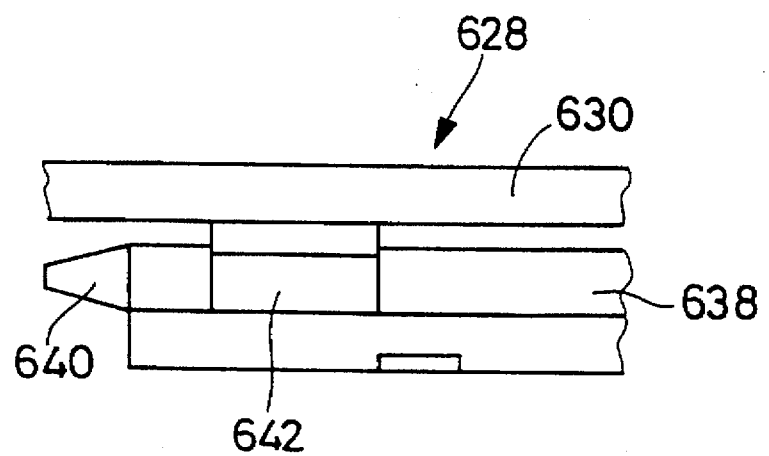
FIG. 20 is an elevation view of a pallet guide rail of the pallet feeding device of FIG. 19.

When each pallet 628 is fed, the pallet 628 is guided by a fixed guide member 634 and a guide rail 638 provided on a movable guide member. As shown in FIG. 20, the guide rail 638 includes a tapered end portion 640 whose diameter gradually decreases into an upstream end thereof. A guide block 642 is fixed to a lower surface of a base table 630 of the pallet 628. The guide block 642 of the pallet 628 is fit on the guide rail 638 while being guided by the tapered end portion 640 of the same 638. Thus, the pallet 628 is positioned in the Y direction. The fixed guide 636 has a first guide surface 644 having an elevation level ensuring that the guide surface 644 supports the pallet 628 whose guide block 642 is engaged with the guide rail 638, such that the base table 630 of the pallet 628 extends horizontally. Meanwhile, the movable guide 634 has a second guide surface 646 slightly lower than the first guide surface 644. Each pallet 628 is fed while being slightly spaced away from the second guide surface 646, and is supported by the guide surface 646 when being disengaged from the guide rail 638.

When the cam 624 is rotated with the ridge 622 being pinched by the pair of rollers 632, each pallet 628 is fed while being positioned in the X direction. A servo motor (not shown) can be controlled to intermittently feed the pallets 628 at a predetermined feeding pitch, or continuously feed the same 628, without needing stopping thereof, from the most upstream EC mounting unit 30 to the most downstream unit 30. In the present, fifth embodiment, too, the pallets 628 can be fed with substantially no spacing being left therebetween. In addition, different sorts of pallets 628 in different sizes can be fed by the single sort of cam member 624.

In the case where each pallet 628 is continuously fed without being stopped, from the most upstream EC mounting area $A_1$ to the most downstream area $A_{16}$, the EC mounting device 82 of each EC mounting unit 30 is controlled for a predetermined time duration to move in the same direction as the direction in which the pallet 628 moves, at the same speed as the speed of movement of the pallet 628, so as to mount an EC on a PCB 110.

FIGS. 21 through 25 shows a sixth embodiment of the present invention, wherein a moving device for moving an EC mounting device 412 is provided by a flat stepper motor 404, 410.

Figure 21:
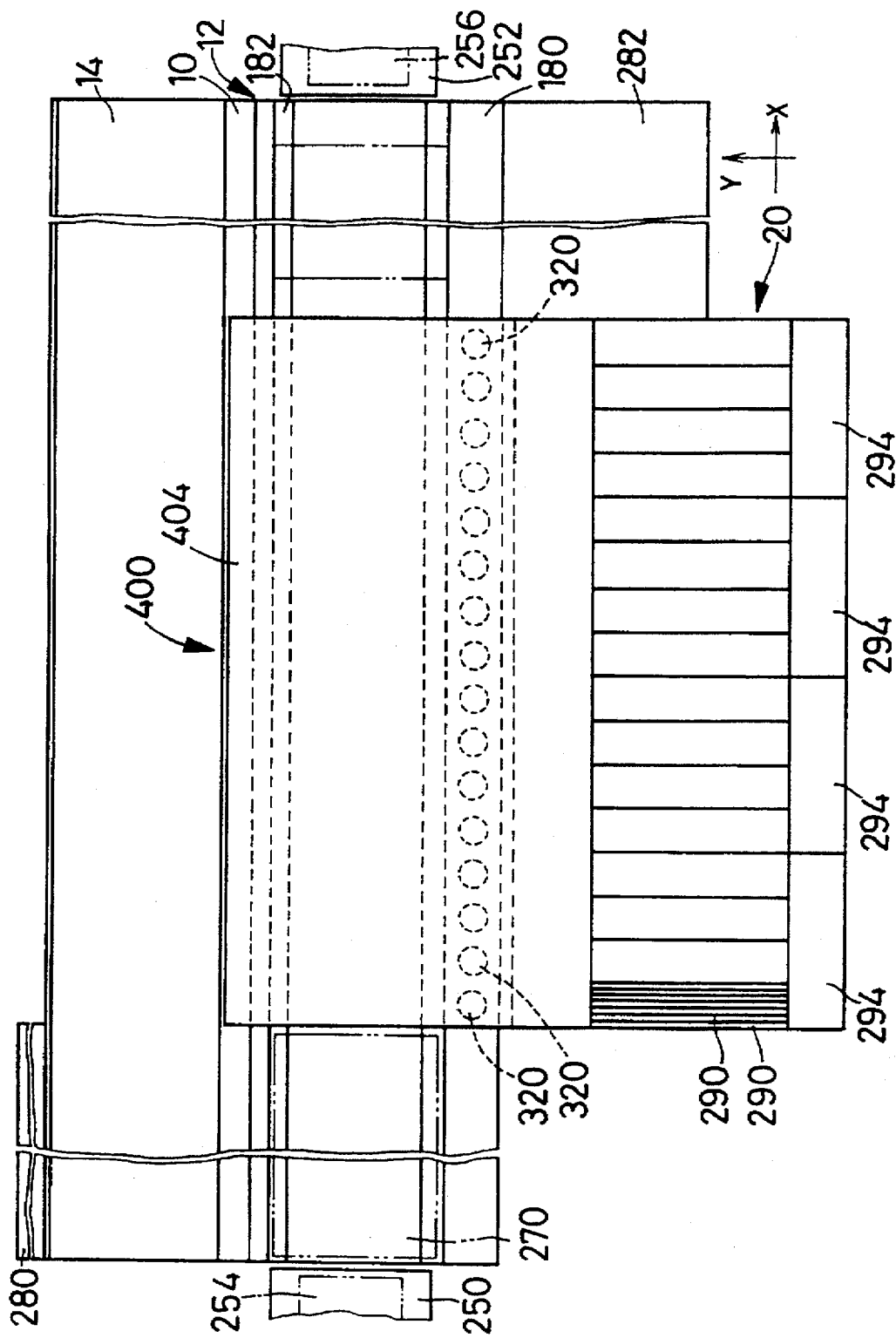
FIG. 21 is a plan view of another EC mounting system as a sixth embodiment of the invention.
Figure 22:
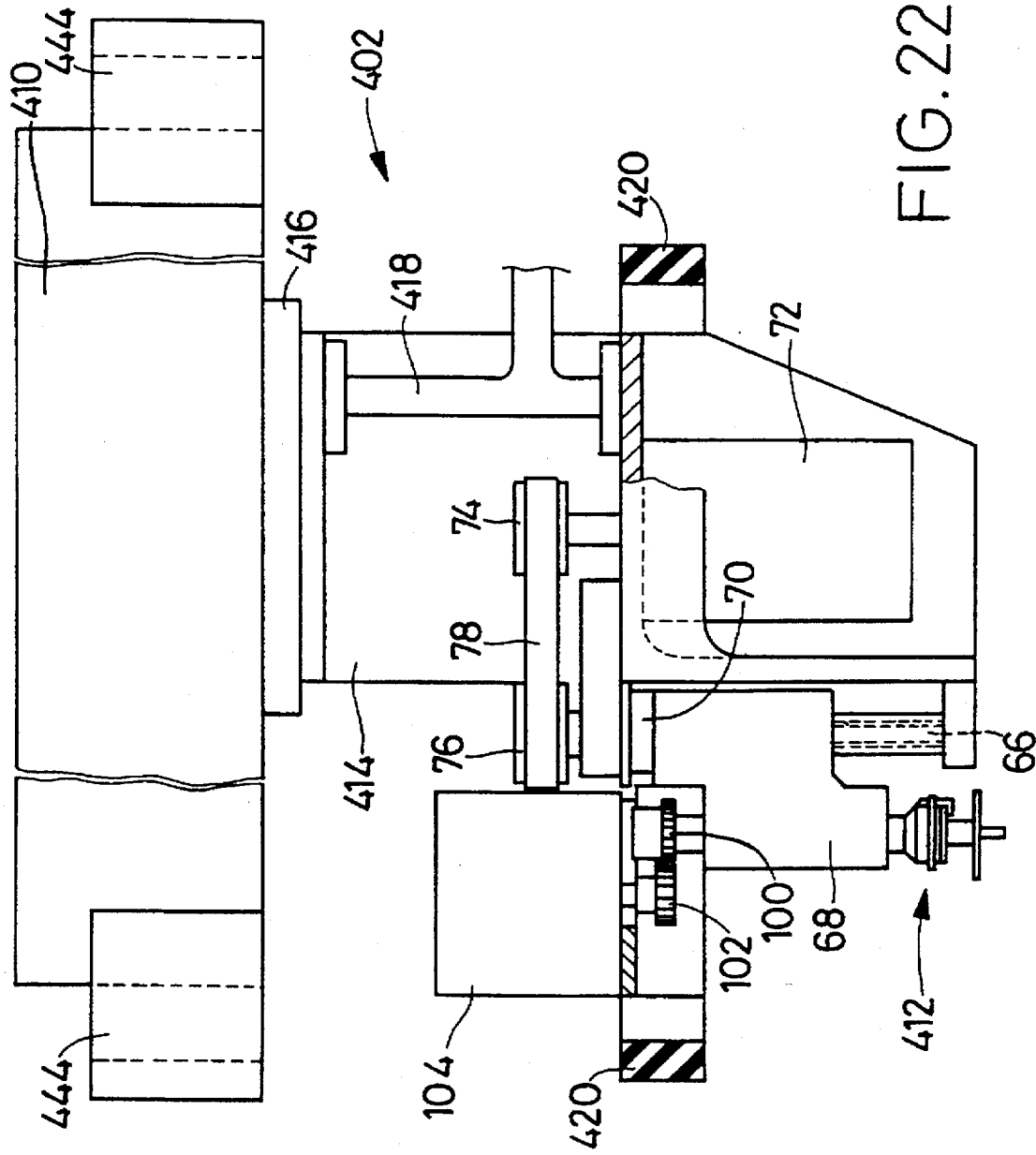
FIG. 22 is a partly cross-sectional, elevation view of an EC mounting unit of the EC mounting system of FIG. 21.

An EC mounting machine 400 shown in FIG. 21 includes sixteen EC mounting units 402 one of which is shown in FIG. 22. As shown in FIG. 21, a stator 404 common to the sixteen units 402 is provided above a pallet feeding device 12 and an EC supplying device 20. The stator 404 is formed of a magnetic material, and a number of salient poles 406 are provided on a lower surface, of the stator 404 and arranged on a grid defined by straight lines parallel to the X direction and straight lines parallel to the Y direction which are perpendicular to each other in a horizontal plane, as shown in FIG. 24.

Figure 23:
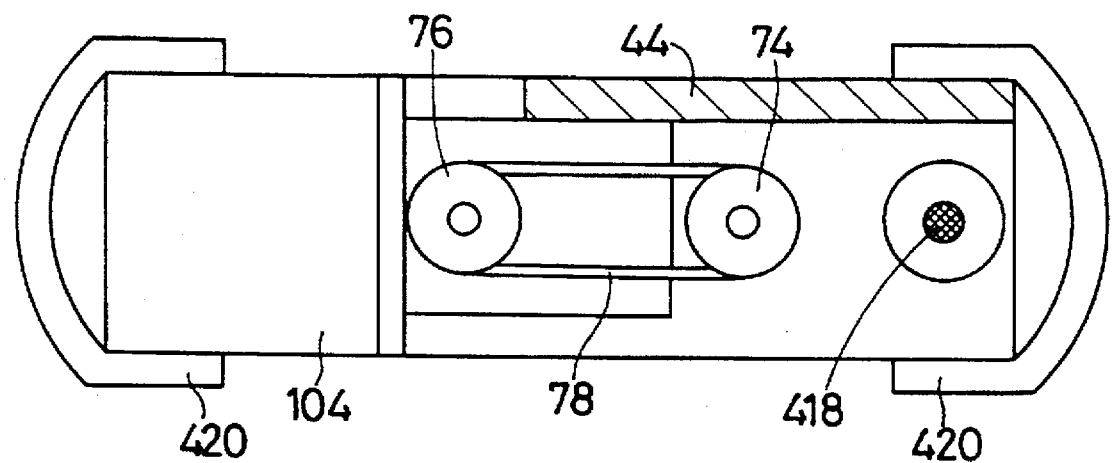
FIG. 23 is a plan view of a support member of the EC mounting unit of FIG. 22.

Sixteen holder members 410 are provided for the stator 404. As shown in FIG. 22, a support member 414 which supports an EC suction device 412 such that the suction device 412 is movable in the Z direction, are is detachably attached to each holder 410 with the help of a chuck 416. A mechanism for moving the EC suction device 412 in the Z direction is similar to that shown in FIG. 3. The same reference numerals as used in FIG. 3 are used to designate the corresponding elements or parts of the present, sixth embodiment shown in FIG. 22, and description of those elements or parts is omitted. Reference numeral 418 denotes a cable as a bundle of lead wires supplying electricity to a Z-direction servo motor 72 and a stepper motor 104. As shown in FIGS. 22 and 23, dampers 420 each formed of rubber are respectively attached to opposite ends of the support member 414 which are remote from each other in the Y direction. The dampers 420 absorb shock produced when the support member 414 possibly collides with adjacent support members 414 or else.

Figure 24:
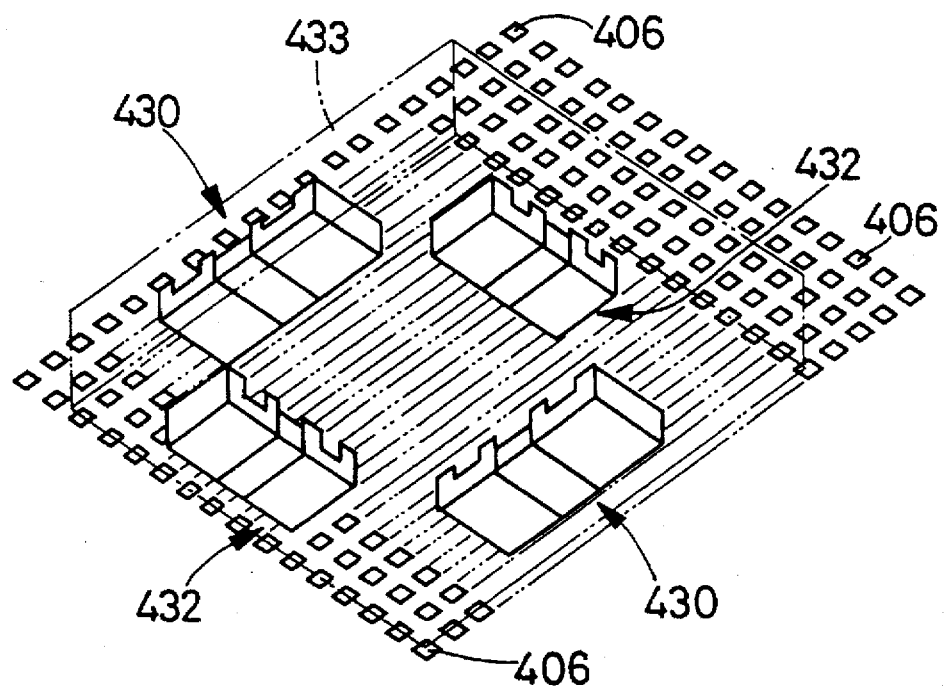
FIG. 24 is a view of a movable-member holding portion of a holder which serves as an EC-mounting-device moving device of the EC mounting system of FIG. 21.
Figure 25:
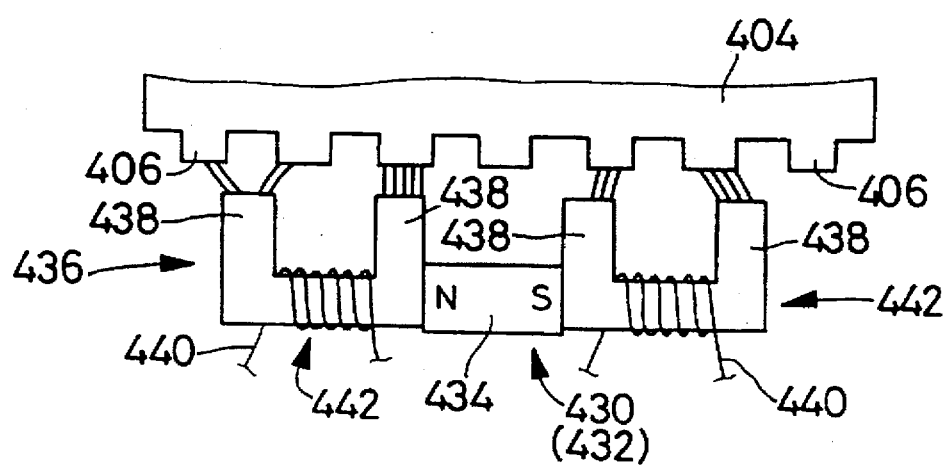
FIG. 25 is an elevation view of an X-direction movable member held by the movable-member holding portion of the holder of FIG. 24.

As shown in FIG. 24, each of the sixteen holders 410 includes a movable-member holding portion 433 which holds or supports two X-direction movable members 430 provided at opposite ends thereof remote from each other in the Y direction, and two Y-direction movable members 432 provided at opposite ends thereof remote from each other in the X direction. As shown in FIG. 25, each of the X-direction and Y-direction movable members 430, 432 includes a permanent magnet 434 and an electromagnet 436. The electromagnet 436 includes two magnet elements 442 each of which is provided by two tooth poles 438 and a coil 440 wound between the two poles 438. The two magnet elements 442 are fixed to an N and an S pole of the permanent magnet 434. The two magnet elements 442 of each X-direction movable member 430 are remote from each other in the X direction, and the two magnet elements 442 of each Y-direction movable member 432 are remote from each other in the Y direction.

The X movable members 430 can be moved relative to the salient poles 406 by controlling the supplying or cutting of electric currents to or from the two coils 440 of each member 430 and changing the directions of the electric currents. The four tooth poles 438 of each X movable member 430 are provided at a pitch, t, ensuring that the four tooth poles 438 are out of position from four successive salient poles 406 by zero, a quarter of the pitch (t/4), half the pitch (t/2), and three quarters of the pitch (3t/4), respectively. In a state shown in FIG. 25, an electric current is supplied to the coil 440 of one element magnet 442 in a direction ensuring that the tooth pole 438 remote from the N pole of the permanent magnet 434 becomes an S pole and the tooth pole 438 near to the N pole of the permanent magnet 434 becomes an N pole, so that the magnetic field of the tooth pole 438 near to the N pole of the magnet 434 is strengthened and the magnetic field of the tooth pole 438 remote from the N pole of the magnet 434 is zeroed.

From the state shown in FIG. 25, each X movable member 430 can be moved in the right-hand direction in the figure, by supplying an electric current to the coil 440 of the other element magnet 442 in a direction ensuring that the tooth pole 438 remote from the S pole of the permanent magnet 434 becomes an N pole and the tooth pole 438 near to the S pole of the magnet 434 becomes an S pole, so that the magnetic field of the tooth pole 438 near to the S pole of the magnet 434 is strengthened and that tooth pole 438 is moved to a position where the tooth pole 438 is accurately opposed to one salient pole 406, face to face.

The X movable members 430 can be moved in a positive and a negative direction of the X direction, by changing the order and/or direction of supplying of electric currents to the two coils 440 of each member 430. The Y movable members 432 can be moved similarly. Each holder 410 can be moved to an arbitrary position in a horizontal plane by combining the respective movements of the pair of X movable members 430 and the pair of Y movable members 432. Thus, the EC suction device 412 supported by each holder 410 is moved to an EC mounting position where an EC held thereby is to be mounted on an PCB 110.

The foregoing is the description of the principle of the flat stepper motor including the stator 404 and the movable-member holding portion 433 of each holder 410. In fact, the X or Y movable members 430, 432 of each holder 410 can be stopped at positions other than the positions where one of the tooth poles 438 is accurately opposed to one of the salient poles 406. This may be done by controlling the energizing currents applied to the coils 440, in small steps. For example, each holder 410 may be adapted to move in each of the X and Y directions, in units of 0.01 mm.

Each holder 410 is supplied with a high-pressure air from an air supplying device (not shown), so that the pressurized air enters between each holder 410 and the stator 404. Thus, a slight spacing is produced between the stator 404 and the X and Y movable members 430, 432, and the resistance to the movements of each holder 410 is effectively reduced.

As shown in FIG. 22, dampers 444 formed of rubber are fixed to opposite ends of each holder 410 which are remote from each other in the Y direction, so as to absorb shock produced when the holder 410 possibly collides with something else.

The stator 404 is common to the sixteen EC mounting units 402, and each holder 410 is movable to any position under the stator 404. However, in the present, sixth embodiment, too, the EC mounting area of each of the sixteen EC mounting units 402 partly or fully overlaps that or those of one or two adjacent EC mounting units 402, in the X direction, like in the embodiment shown in FIG. 11. That is, the movement ranges of each holder 410 overlaps that or those of one or more adjacent holders 410 in the X direction. A portion of the stator 404 which is needed for each holder 410 to move in an EC mounting area thereof cooperates with each holder 410, the X and Y movable members 430, 432, and a Z-direction moving device provided by a Z-direction slide member 68 and a Z-direction servo motor 72, to provide the EC-mounting-device moving device of each EC mounting unit 402.

When ECs are mounted on PCBs 110 by the present EC mounting system, the EC suction devices 412 are moved to the EC supplying device 20 so as to take the ECs from the device 20, and each of the held EC-posture pick-up devices 320 picks up the posture of the EC held by a corresponding one of the EC suction devices 412. Subsequently, each EC suction device 412 is moved to an EC mounting position where the suction device 412 mounts the EC on the PCB 110. During the last step, the holder 410 of each EC suction device 412 is controlled not to collide with that or those of one or two adjacent EC suction devices 412. Each holder 410 is moved by the magnetic forces produced by the energization or deenergization of the respective electromagnets 436 of the X and Y movable members 430, 432. Thus, what is moved is only the holder 410 of each EC suction device 412, and no guide member or else that resists to the movement of the holder 410 is needed. Therefore, each holder 410 can easily be moved to any position under the stator 404, while being prevented from colliding with the other holders 410.

Since in the present embodiment the EC-mounting-device moving device is provided by the flat stepper motor 404, 410, no guide member is needed in moving each holder 410, i.e., each holder 410 is movable to any position under the stator 404. Thus, the degrees of freedom in determining the EC mounting areas $A_1$–$A_{16}$ and/or determining the order of mounting of ECs are increased, and accordingly ECs can be mounted on PCBs 110 with high efficiency.

Even in the case where the supply of electric currents to the electromagnets 436 of each holder 410 is stopped for some reason, each holder 410 is prevented from falling off the stator 404 because the X and Y movable members 430, 432 have the permanent magnets 434 and the holder 410 is attracted by the stator 404.

Although in the present embodiment the single stator 404 is commonly used for all the sixteen EC mounting units 402, it is possible to employ a plurality of stators 404 and use each stator 404 by a corresponding group of EC mounting units 402 out of the sixteen units 402. For example, four stators 404 may be employed and each stator 404 may commonly be used for corresponding four units 402. In the latter case, the holder 410 of each unit 402 is movable to any position under a corresponding one of the four stators 404.

While in the present embodiment each holder 410 holds the two X or Y movable members 430, 432 at opposite end portions thereof remote from each other in the Y or X direction, it is possible to provide an additional X or Y movable member 430, 432 in a central portion of each holder 410. Moreover, an appropriate number of the X or Y movable members 430, 432 may be employed depending upon the size or other parameters of the holder 410.

In each of the first to sixth embodiments, the reference marks fixed to each PCB 110 are picked up only in the waiting area and the positioning errors of the PCB 110 are calculated based on the obtained images of the reference marks. It is possible to pick up the reference marks fixed to each PCB 110 also at the PCB unloading position and calculate additional or second positioning errors based on the picked-up reference marks. In the latter case, each EC mounting unit 30 may be operated based on the first positioning errors which are obtained in the waiting area and which are modified by proportional distribution based on the second positioning errors.

The pallet feeding device 12, 582, 620 may suffer from dimensional errors produced when the device 12 is manufactured, i.e., "manufacturing errors". Moreover, the dimensions of the feeding device 12, 582, 620 may slightly increase due to increased temperatures. Those may lead to increasing the positioning errors of each PCB 110. In the case where the reference marks fixed to each PCB 110 are picked up also at the PCB unloading position and additional positioning errors are determined based on the picked-up images as described above, the positions to which each EC suction device 82, 412 is moved may be modified on the assumption that the differences of the first positioning errors obtained in the waiting area and the second positioning errors obtained at the PCB unloading position proportionally increase from the waiting area to the unloading position. In the latter case, the accuracy of mounting of ECs on PCBs 110 is much improved.

Furthermore, it is possible to pick up, at the PCB unloading position, the respective images of some ECs mounted on each PCB 110, and calculate the errors of EC mounting positions on each PCB 110. In this case, the positions to which the EC mounting device 82, 412 of each EC mounting unit 30 is moved, may be modified based on the obtained EC- mounting-position errors. The control needed to maintain the accuracy of EC mounting based on the images of reference marks and/or ECs picked up at the PCB unloading position, may automatically be carried out by the computer of the control device 330, or may manually be carried out by an operator of the present EC mounting system.

In each of the illustrated embodiments, the EC-mounting-position correction data obtained based on the positioning errors of each PCB 110, are transferred from each of the EC-mounting-position correction data memories WM, $M_1$–$M_{15}$ to a downstream adjacent memory $M_2$–$M_{16}$, when each PCB 110 is fed to a corresponding EC mounting area $A_2$–$A_{16}$. However, the EC-mounting-position correction data may be supplied to each EC mounting unit 30 in other manners.

For example, it is possible to employ a memory which stores EC-mounting-position correction data obtained in the waiting area for each of a plurality of PCBs 110 till the mounting of all ECs on each PCB 110 is completed. In the latter case, the EC-mounting-position correction data obtained for each PCB 110 are supplied to each EC mounting unit 30 in response to a request from a computer of each unit 30 or a command from a host computer of the control device 330, when each PCB 110 is fed to a corresponding EC mounting area $A_1$–$A_{16}$.

In each of the illustrated embodiments, each pallet 112, 500, 586, 608, 628 is designed to support a single PCB 110. However, it is possible to employ pallets each of which is designed to support a plurality of PCBs 110.

In the first embodiment shown in FIGS. 1 to 13, the transverse bar 230 has the single group of feeding projections 232 and is designed to feed the single sort of pallets 112. However, it is possible to employ a transverse bar which has a plurality of groups of feeding projections or pins fixed thereto at different pitches and is designed to feed a plurality of sorts of pallets having different sizes. In the latter case, the different groups of feeding projections are fixed at different positions on an outer circumferential surface of the bar, and the bar is rotated so that an appropriate group of feeding projections are engaged with, and disengaged from, a corresponding sort of pallets being fed by the EC mounting system. In this case, the single transverse bar can be used for feeding each of different sorts of pallets having different sizes, and the production cost of the EC mounting system and/or the time needed for size changing is reduced.

In each of the illustrated embodiments, a PCB 110 is put on each pallet 112, 500, 586, 608, 628 in the waiting area after the pallet 112 has been transferred to the waiting area. However, it is possible to put a PCB 110 on each pallet 112, 500, 586, 628, at a different position or in a different area. For example, a PCB 110 may be put on each pallet which has been returned to the previously described returned-pallet position.

In each of the illustrated embodiments, the PCB unloading device 256 which unloads each PCB 110 on which ECs have been mounted, from each pallet 112, 500, 586, 608, 628, is provided on the downstream side of the pallet feeding device 12. However, this is not essentially required, and it is possible to provide the unloading device 256 at a different position, for example, at a position above the pallet returning route of the returning device 14 and adjacent to the PCB unloading position; at the returned-pallet position; or at a position between the returned-pallet position and a position above the pallet returning route of the returning device 14 and adjacent to the PCB unloading position.

In the first embodiment shown in FIGS. 1 to 13, the respective rotary arms 54 of each pair of adjacent EC mounting units 30 are controlled to take, when passing each other, a posture in which each rotary arm 54 extends parallel to the Y direction. However, this is not essentially required. For example, the rotary arm 54 supporting the EC suction device 82 which has held an EC and is moving to mount the EC on a PCB 110, may be controlled to take the above posture so that the EC held by the suction device 82 passes over the held-EC-posture pick-up device 320, and the adjacent rotary arm or arms 54 may be controlled not to take the posture in question unless the adjacent rotary arm or arms 54 interferes or interfere the rotary arm assuming the posture in question. The rotary arm 54 may be replaced by an X slide member which is supported by the Y slide member 38 and is movable in the X direction. In the last case, too, the EC suction device 82, 412 supported by each X slide member can be moved in a three-dimensional space.

In each of the illustrated embodiments, the respective movement ranges (i.e., EC mounting areas $A_1$–$A_{16}$) of each pair of adjacent EC mounting devices 82, 402 partly overlap each other. However, the overlapping of EC mounting areas $A_1$–$A_{16}$ is not essentially required. It is possible to employ EC mounting areas with substantially spacings being provided therebetween. In the latter case, the angular range of rotation of each rotary arm 54 may be determined not to overlap that or those of an adjacent rotary arm or arms 54.

In each of the illustrated embodiments, the respective movement ranges (i.e., EC mounting areas $A_1$–$A_{16}$) of each pair of adjacent EC mounting devices 82, 402 partly overlap each other. However, the sixteen EC mounting areas $A_1$–$A_{16}$ may include two or more areas which completely coincide with each other, or two or more areas which are contiguous with each other. That two EC mounting areas are contiguous with each other means that the two areas share a common border. As far as the present application is concerned, the "overlapping" of EC mounting areas should be construed to encompass the last manner.

In each of the illustrated embodiments, each EC suction device 82, 412 is supported by a corresponding rotary arm 54 such that the suction device 82, 412 can be moved up and down. However, it is possible that each rotary arm 54 be supported by a corresponding Y slide member 38 such that the rotary arm 54 is not only rotatable and but also is movable up and down in a direction perpendicular to the surface of each PCB 110. In the latter case, the EC suction device 82, 412 attached to a free-end portion of each rotary arm 54 is moved up to, or away from, an EC supplying cartridge 290, or a PCB 110, by the movements of the rotary arm 54, so that the suction device 82, 412 takes ECs from the cartridge 290 and mounts the ECs on the PCB 110. Thus, no Z-direction moving device is provided on each rotary arm 54, and the weight of each rotary arm 54 is reduced as such. Therefore, the inertia of the rotary arm 54 is reduced. Since only the EC suction device 82, 412 is attached to the free-end portion of each rotary arm 54, the free-end portion of each rotary arm 54 enjoys a simple and small-size construction, so that the interferences between the respective EC suction devices 82, 412 of each pair of adjacent EC mounting units 30 can easily be prevented.

In the first embodiment shown in FIGS. 1 to 13, the first group of alternate, eight EC mounting units 30 out of the sixteen units 30 mount ECs on PCBs 110 when the second group of alternate, eight units 30 take ECs from the EC supplying device 20. However, it is possible to control the sixteen units 30 to concurrently take ECs and concurrently mount the ECs on PCBs 110, or control each unit 30 asynchronously with the other units 30 to take and mount an EC on a PCB 110. In the last case, when one unit 30 finishes the mounting of an EC on a PCB 110 before the other units mount ECs on PCBs 110, the unit 30 in question may be controlled to start to take and mount another EC without waiting for the other units 30 to finish their operations. Thus, the efficiency of EC mounting is improved.

In the case where the EC mounting areas $A_1$–$A_{16}$ are designed not to overlap one another in the X direction, i.e., designed to be spaced from one another, each EC suction device 82, 412 can be controlled to take and mount ECs, independently of the other EC suction devices 82, 412, since there is no possibility that the suction devices 82, 412 interfere with one another when being moved within the respective EC mounting areas thereof.

In each of the illustrated embodiments, each pair of adjacent EC mounting areas $A_1$–$A_{16}$ are designed to overlap each other in the X direction. If each EC mounting device 82, 412 is controlled to take and mount ECs, independently of the other EC mounting devices 82, 412, there is some possibility that the adjacent suction devices 82, 412 interfere with each other when being moved within the respective EC mounting areas thereof. In order to prevent the interferences, it is desirable to employ a plurality of unit computers each of which controls the EC taking and mounting operations of a corresponding EC mounting device 82, 412, and employ a host computer which coordinates the respective operations of the unit computers. Specifically described, the host computer collects information from each unit computer, monitors the possibility of interference of each EC mounting device 82, 412, and operates for controlling each unit computer to prevent the interferences.

The host computer commands each unit computer to supply thereto data indicative of (a) a direction in which a corresponding EC mounting device 82, 412 is moved to a target position and (b) a distance of movement of the same 82, 412 to the target position. Based on the supplied data, the host computer judges whether or not each pair of adjacent EC mounting devices 82, 412 will interfere with each other. If a positive judgment is made, the host computer judges, for example, whether it is possible to prevent the interference by changing the route of movement of one of the two devices 82, 412. Even if another positive judgment is made, the host computer judges whether an EC mounting device 82, 412 adjacent to that "one" device 82, 412 on the opposite side of the other device 82, 412 will interfere with that one device 82, 412 which will be moved in the changed route. If a positive judgement is made, the host computer judges whether it is possible to prevent the interference by changing the route of movement of another adjacent device 82, 412. If the number of the EC mounting devices 82, 412 which need the changing of the movement routes thereof is considerably small, that is, if an interference is prevented by changing the movement route or routes of only a small number of EC mounting devices 82, 412, the host computer may actually change the movement route or routes. However, if the number of EC mounting devices 82, 412 which need the changing of the movement routes thereof is too large (e.g., greater than four), or if it is impossible to prevent the interference by changing the movement routes of the other EC mounting devices 82, 412, the host computer may operate for stopping an appropriate one or ones of the EC mounting devices 82, 412 and thereby preventing the interference.

In each of the illustrated embodiments, ECs (electronic components) are supplied in the form of an EC carrier tape by each of the EC supplying cartridges 290. However, ECs may be supplied by other sorts of EC supplying devices. For example, it is possible to employ (a) an EC supplying device which supports ECs in an array and moves, to the EC supplying position, each of the ECs by applying vibration thereto, or (b) a device which moves pallets each of which accommodates one or more ECs.

In each of the illustrated embodiments, each held-EC-posture pick-up device 320 which picks up the posture of an EC held by a corresponding EC suction device 82, 412 is provided by a CCD camera 322. However, the pick-up device 320 may be provided by other sensors such as a line-image sensor. The line-image sensor picks up each line image of an object as the object is moved relative to the sensor. In the latter case, the image of the posture of an EC held by each EC suction device 82, 412 can be obtained without stopping the movement of the suction device 82, 412.

In each of the illustrated embodiments, each EC mounting device 82, 412 holds an EC by using vacuum or negative pressure. However, it is possible to other sorts of EC mounting device such as a device including a chuck for holding and releasing an EC.

In each of the illustrated embodiments, the sixteen EC mounting units 30 are arranged along a straight line. However, the principle of the present invention may be applied to an EC mounting system wherein a plurality of EC mounting units are arranged along a curve such as a circular arc.

In each of the illustrated embodiments, the sixteen EC mounting units 30, the pallet feeding device 12, and the pallet returning device 14 are controlled by the common computer of the control device 330. However, it is possible to employ individual computers for those elements 30, 12, 14. For example, sixteen unit computers may be employed for the sixteen EC mounting units 30, and an independent computer may be employed to control the feeding of the pallets 112, 500, 586, 608, 628. In the latter case, a host computer may further be provided to integrate the respective operations of the seventeen computers so as to synchronize the operations of the sixteen EC mounting units 30 and the pallet feeding device 12, and additionally supply data to each of the computers. This is advantageous in the above-described case where each of the EC mounting devices 82, 412 is controlled independently of the other devices 82, 412 and the host computer integrates the unit computers for preventing the interferences of each pair of adjacent EC mounting devices 82, 412.

An appropriate one or ones of the various elements (e.g., pallet feeding device 12, pallet returning device 14, and PCB loading and unloading devices 250, 252) of each of the first to sixth embodiments may be combined with an appropriate one or ones of the elements of the other embodiments.

It is to be understood that the present invention may be embodied with other changes, improvements, and modifications that may occur to those skilled in the art without departing from the scope and spirit of the invention defined in the appended claims.

What is claimed is:

1. An electronic-component mounting system comprising:
   a plurality of supporting devices each of which supports and positions at least one object, said supporting devices being movable along a reference line;
   a plurality of mounting units arranged along said reference line, each of said mounting units including (a) a mounting device which mounts at least one electronic component on said at least one object supported by each of said supporting devices, and (b) a moving device which moves said mounting device in a three-dimensional space, each of said mounting units having a mounting area in which said mounting device mounts said at least one component on the at least one object;
   a feeding device which feeds said plurality of supporting devices along said reference line such that said at least one object supported by each of said supporting devices is moved from the mounting area of a most upstream one of said mounting units to the mounting area of a most downstream one of said mounting units in a direction of feeding of the supporting devices, while said feeding device positions each of said supporting devices when said mounting device of each of said supporting devices mounts said at least one component on said at least one object supported by each of said supporting devices;
   a positioning error detector which detects an error of positioning of said at least one object with respect to each of said supporting devices located in a waiting area where each of said supporting devices waits for being fed by said feeding device; and
   a control device which controls each of said mounting units so that said mounting device of each of said mounting units mounts said at least one component, at a position corrected based on the detected positioning error, on said at least one object supported by each of said supporting devices fed to the mounting area of each of said mounting units.

2. A mounting system according to claim 1, further comprising:
   a returning device which returns each of said supporting devices fed by said feeding device to a downstream end of a feeding route in said direction of feeding of said supporting devices, from said downstream end to said waiting area via a returning route different from said feeding route;
   an unloading device which is provided on said returning route including said downstream end and said waiting area, said unloading device unloading, from each of said supporting devices, said at least one object on which the respective mounting device of each of said mounting units have mounted the at least one component; and
   a loading device which loads at least one new object on each of said supporting devices after said unloading device has unloaded therefrom said at least one object on which the at least one component has been mounted.

3. A mounting system according to claim 1, wherein said positioning error detector comprises means for detecting, as said error of positioning, at least one of (a) a positional error of said at least one object with respect to each of said supporting devices in a first direction parallel to a straight line as said reference line, (b) a positional error of said at least one object with respect to each of said supporting devices in a second direction perpendicular to said first direction, and (c) an angular error of said at least one object with respect to each of said supporting devices about a third direction perpendicular to said first and second directions.

4. A mounting system according to claim 1, wherein said control device comprises correcting means for correcting, based on said detected positioning error, a predetermined position where said mounting device of each of said mounting units mounts said at least one component on said at least one object supported by each of said supporting devices fed to the mounting area of each of said mounting units.

5. A mounting system according to claim 4, wherein said correcting means comprises means for determining, based on said detected positioning error, a correction value to correct said predetermined position such that said predetermined position corrected with said correction value compensates for said detected positioning error.

6. A mounting system according to claim 5, further comprising at least one memory which stores data representative of said correction value.

7. A mounting system according to claim 4, wherein said correcting means comprises means for determining a plurality of corrected positions based on said detected positioning error and predetermined positions where the respective mounting device of each of said mounting units mount the at least one component on said at least one object supported by each of said supporting devices fed to the respective mounting areas of the mounting units, each of said corrected positions compensating for each detected position error.

8. A mounting system according to claim 7, further comprising at least one memory which stores data representative of said corrected positions.

9. A mounting system according to claim 1, further comprising:
   a supplying device which supplies said at least one electronic component to said mounting device of each of said mounting units so that said mounting device holds said at least one component supplied by said supplying device; and
   a holding error detector which detects an error of holding of said at least one component by said mounting device, wherein said control device comprises means for controlling each of said mounting units so that said mounting device of each of said mounting units mounts said at least one component, at said position corrected based on said detected positioning error and the detected holding error, on said at least one object supported by each of said supporting devices fed to the mounting area of each of said mounting units.

10. A mounting system according to claim 1, further comprising a mounting error detector which detects an error of mounting of said at least one component by said mounting device of each of said mounting units, and wherein said control device comprises means for controlling each of said mounting units so that said mounting device of each of said mounting units mounts an electronic component, at a position corrected based on a newly detected positioning error and the detected mounting error, on a new object supported by each of said supporting devices fed to the mounting area of each of said mounting units.

11. A mounting system according to claim 1, wherein said control device comprises means for controlling the respective mounting devices of each of said mounting units to concurrently mount the at least one component on said at least one object, at positions corrected based on said detected positioning error.

12. A mounting system according to claim 1, wherein said control means comprises means for controlling said moving device of each of said mounting units to move said mounting device of each of said mounting units within a first range which at least partly overlaps, along said reference line, a second range within which the mounting device of at least one adjacent mounting unit of said plurality of mounting units is moved by the moving device of said at least one adjacent mounting unit, the mounting device of each of said mounting units mounting said at least one component on said at least one object within said first range, the mounting device of said at least one adjacent mounting unit mounting at least one electronic component on said at least one object within said second range.

13. A mounting system according to claim 1, further comprising a supplying device which supplies said at least one component to the mounting device of each of said mounting units and at least one component to the mounting device of at least one adjacent mounting unit, and wherein the moving device of each of said mounting units moves the mounting device of each of said mounting units within a third range which at least partly overlaps, along said reference line, a fourth range within which the mounting device of said at least one adjacent mounting unit is moved by the moving device of the at least one adjacent mounting unit, the mounting device of each of said mounting units taking said at least one component from said supplying device within said third range, the mounting device of said at least one adjacent mounting unit taking said at least one component from said supplying device within said fourth range.

14. A mounting system according to claim 1, wherein said each supporting device comprises a positioning device which positions said at least one object in at least one of a first direction parallel to a straight line as said reference line, a second direction perpendicular to said first direction, and a third direction perpendicular to said first and second directions.

15. A mounting system according to claim 1, wherein said each of said supporting devices comprises:
- a pair of grooved members having a pair of grooves, respectively, which extend parallel to each other in a first direction parallel to a straight line as said reference line, said grooves cooperating with each other to support said at least one object;
- a plurality of hold-down members which are supported by each one of said pair of grooved members and extend in a second direction perpendicular to said first direction, from one of said pair of grooved members toward the other of said pair of grooved members; and
- a plurality of movable members which are movable in a third direction perpendicular to said first and second directions, toward said plurality of hold-down members to cooperate with the plurality of hold-down members to sandwich said at least one object and thereby position the at least one object in said first, second, and third directions.

16. A mounting system according to claim 1, wherein said feeding device comprises a positioning device which positions each of said supporting devices in at least one of a first direction parallel to a straight line as said reference line, a second direction perpendicular to said first direction, and a third direction perpendicular to said first and second directions.

17. A mounting system according to claim 16, wherein said feeding device comprises an intermittently feeding device which intermittently feeds said supporting devices in said first direction.

18. A mounting system according to claim 17, wherein said intermittently feeding device comprises:
- a transverse bar which has a plurality of feeding projections arranged in said first direction, is rotatable about an axis line thereof parallel to said first direction, and is movable forward and backward in said first direction, said feeding projections being engageable with, and disengageable from, said supporting devices;
- a first drive device which rotates said transverse bar to cause said feeding projections to engage, and disengage from, said supporting devices; and
- a second drive device which intermittently moves said transverse bar forward in said first direction while said feeding projections are engaged with said supporting devices and moves the bar backward in said first direction while the projections are disengaged from the supporting devices.

19. A mounting system according to claim 17, wherein each of said supporting devices comprises a circular hole whose diameter increases to open and an elongate hole whose cross section increases to open, said circular and elongate holes being arranged in said first direction, and wherein said intermittently feeding device comprises:
- a plurality of positioning pins which are arranged in said first direction and each of which is movable in said third direction;
- a plurality of biasing members each of which biases a corresponding one of said positioning pins in said third direction;
- a feed member having a plurality of air chambers which support said plurality of positioning pins and said plurality of biasing members, respectively, such that two biasing members of said plurality of biasing members retract corresponding two positioning pins of said plurality positioning pins to be disengaged from said circular and elongate holes of each of said supporting devices;
- an air supplying device which supplies pressurized air to two air chambers of said plurality of air chambers to advance said corresponding two positioning pins of said plurality of positioning pins, against respective biasing actions of said two biasing members of said plurality of biasing members, to engage said two positioning pins with said circular and elongate holes of said each supporting device and thereby position each of said supporting devices in said first and second directions; and
- a drive device which moves, when said two positioning pins are engaged with said circular and elongate holes of each of said supporting devices, said feed member to feed each of said supporting devices, forward in said first direction and moves, when the two pins are disengaged from the two holes of each of said supporting devices, said feed member backward in said first direction.

20. A mounting system according to claim 16, wherein said feeding device comprises a continuously feeding device which continuously feeds said supporting devices in said first direction.

21. A mounting system according to claim 20, wherein said continuously feeding device comprises:
- a cylindrical cam which extends in said first direction, has at least one of a spiral ridge and a spiral groove, and is rotatable about an axis line thereof parallel to said first direction;
- at least one cam follower which is engaged with said at least one of said spiral ridge and said spiral groove, said cam follower being connected to each of said supporting devices; and
- a drive device which rotates said cylindrical cam about said axis line thereof to continuously feed each of said supporting devices in said first direction while continuously positioning each of said supporting devices in said first direction.

22. A mounting system according to claim 16, wherein each of said supporting devices has at least one notch, and wherein each of said positioning devices comprises:
- a plurality of positioning pins which are arranged at a regular interval in said first direction and each of which is movable in said second direction;
- a plurality of biasing members each of which biases a corresponding one positioning pin of said plurality of positioning pins in said second direction; and
- a support member which supports said plurality of positioning pins and said plurality of biasing members such that each biasing member of said plurality of biasing members advances said corresponding one positioning pin to engage one of said at least one notch of each of said supporting devices and thereby position each of said supporting devices in said first direction, and permits said one positioning pin to retract into said support member against a biasing action of said biasing member and thereby allow each of said supporting devices to be fed in said first direction.

23. A mounting system according to claim 16, wherein each of said supporting devices comprises a circular hole whose diameter increases to open and an elongate hole whose cross section increases to open, said circular and elongate holes being arranged in said first direction, and wherein said positioning device comprises:
- a plurality of positioning pins which are arranged at a regular interval in said first direction and each of which is movable in said third direction;
- a plurality of biasing members each of which biases a corresponding positioning pin of said plurality of positioning pins in said third direction;
- a support member having a plurality of air chambers which support said plurality of positioning pins and said plurality of biasing members, respectively, such that two biasing members of said plurality of biasing members retract a corresponding two positioning pins of said plurality of positioning pins to disengage from said circular and elongate holes of each of said supporting devices and thereby allow each of said supporting devices to be fed in said first direction; and
- an air supplying device which supplies a pressurized air to two air chambers of said plurality of of air chambers to advance said corresponding two positioning pins, against respective biasing actions of said two biasing members, to cause said corresponding two positioning pins to engage said circular and elongate holes of each of said supporting devices and thereby position each of said supporting devices in said first and second directions.

\* \* \* \* \*